(12) United States Patent
Noda et al.

(10) Patent No.: US 10,325,958 B2
(45) Date of Patent: Jun. 18, 2019

(54) MEMORY DEVICE AND METHOD FOR MANUFACTURING SAME

(71) Applicant: TOSHIBA MEMORY CORPORATION, Tokyo (JP)

(72) Inventors: Kotaro Noda, Mie (JP); Mutsumi Okajima, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 37 days.

(21) Appl. No.: 15/696,756

(22) Filed: Sep. 6, 2017

(65) Prior Publication Data

US 2018/0069050 A1    Mar. 8, 2018

Related U.S. Application Data

(60) Provisional application No. 62/384,320, filed on Sep. 7, 2016.

(51) Int. Cl.
*H01L 29/06*      (2006.01)
*H01L 27/24*      (2006.01)
*H01L 45/00*      (2006.01)

(52) U.S. Cl.
CPC ........ *H01L 27/249* (2013.01); *H01L 27/2436* (2013.01); *H01L 27/2454* (2013.01); *H01L 45/1683* (2013.01); *H01L 45/04* (2013.01); *H01L 45/1226* (2013.01); *H01L 45/146* (2013.01)

(58) Field of Classification Search
CPC ............. H01L 27/2436; H01L 27/2454; H01L 27/249; H01L 27/2472; H01L 45/04; H01L 45/085; H01L 45/1226; H01L 45/1233; H01L 45/1253; H01L 45/146

USPC .......................................................... 257/5
See application file for complete search history.

(56) References Cited

U.S. PATENT DOCUMENTS 9,246,088 B2 *   1/2016   Yamato ............... H01L 45/1226
2008/0175032 A1   7/2008   Tanaka et al.
2013/0037774 A1   2/2013   Song et al.
(Continued)

FOREIGN PATENT DOCUMENTS

JP    2008-181978 A    8/2008
JP    2013-115436 A    6/2013

*Primary Examiner* — Brook Kebede
(74) *Attorney, Agent, or Firm* — Foly & Lardner LLP

(57) ABSTRACT

A memory device includes a first interconnect extending in a first direction, semiconductor members extending in a second direction, a second interconnect provided between the semiconductor members and extending in a third direction, a first insulating film provided between the semiconductor member and the second interconnect, third interconnects extending in the second direction, fourth interconnects provided between the third interconnects and arranged along the second direction, a resistance change film provided between the third interconnect and the fourth interconnects, and a first film. The first film is provided between the second interconnect and the fourth interconnect, interposes between the semiconductor member and the resistance change film, and not interpose between the semiconductor member and the third interconnect connected to each other. A first end of the semiconductor member is connected to the first interconnect. The third interconnect is connected to a second end of the semiconductor member.

20 Claims, 29 Drawing Sheets

(56) References Cited

U.S. PATENT DOCUMENTS

2013/0134377 A1   5/2013  Park et al.
2015/0263278 A1*  9/2015  Ode .................... H01L 27/2454
                                                                         257/5
2016/0093801 A1   3/2016  Nishihara

* cited by examiner

MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/384,320, filed on Sep. 7, 2016; the entire contents of which are incorporated herein by reference.

FIELD

Embodiments relate to a memory device and a method for manufacturing the same.

BACKGROUND

In recent years, there has been proposed a memory device in which resistance change memory cells are integrated three-dimensionally. Such a stacked type memory device includes a plurality of vertical interconnects and a plurality of horizontal interconnects. A resistance change film is provided at the intersection of the interconnects. In such a stacked type memory device, increasing the number of stacked layers in the vertical direction makes it difficult to process the stacked body. This causes the problem of manufacturing difficulty.

DETAILED DESCRIPTION

Figure 1:
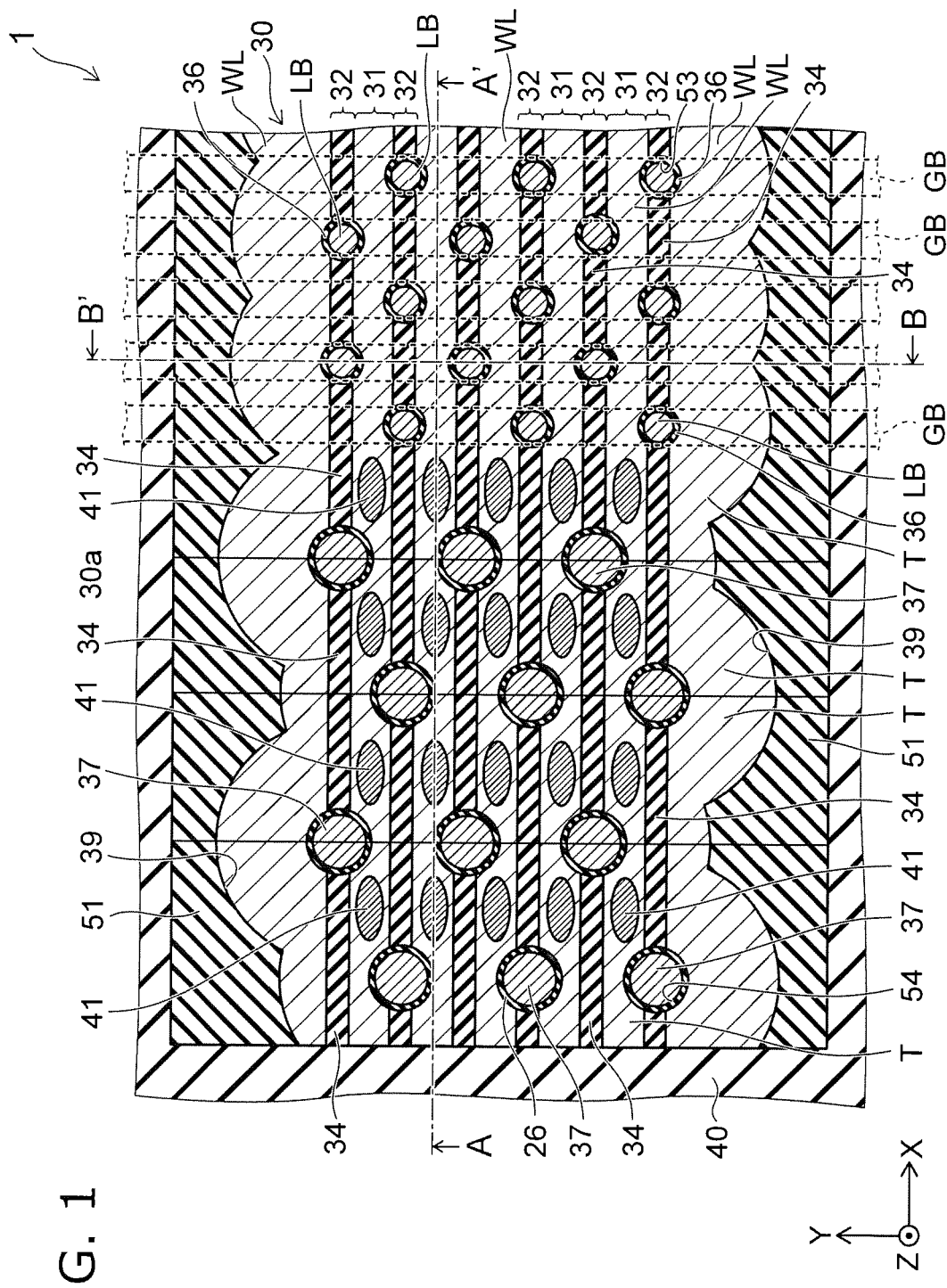
FIG. 1 is a sectional view showing a memory device according to a first embodiment.

A memory device according to one embodiment, includes a first interconnect extending in a first direction, a plurality of semiconductor members extending in a second direction crossing the first direction, a second interconnect provided between the plurality of semiconductor members and extending in a third direction crossing the first direction and the second direction, a first insulating film provided between one of the plurality of semiconductor members and the second interconnect, a plurality of third interconnects extending in the second direction, a plurality of fourth interconnects provided between the plurality of third interconnects and arranged along the second direction, a resistance change film provided between one of the plurality of third interconnects and the plurality of fourth interconnects, and a first film. The first film is provided between the second interconnect and one of the fourth interconnects, interposes between one of the semiconductor members and the resistance change film, and not interpose between one of the semiconductor members and one of the third interconnects connected to each other. A first end of the semiconductor member is connected to the first interconnect. One of the plurality of third interconnects is connected to a second end of one of the plurality of semiconductor members.

A method for manufacturing a memory device according to one embodiment, includes forming a first film on an intermediate structural body. The intermediate structural body has a first interconnect extending in a first direction, a plurality of semiconductor members provided on the first interconnect, extending in a second direction crossing the first direction, and having a first end connected to the first interconnect, a first insulating film provided on a side surface of one of the plurality of semiconductor members, and a second interconnect provided on a side surface of the first insulating film and extending in a third direction crossing the first direction and the second direction. The method includes forming a stacked body by alternately stacking a plurality of second insulating films and a plurality of second films on the first film. The second film is different in composition from the second insulating film. The method includes forming a plurality of trenches in a portion including a directly overlying region of the semiconductor member in the stacked body. The method includes burying an insulating member in the trench. The method includes forming a hole in the directly overlying region of the semiconductor member in the stacked body. The hole divides the insulating member and reaches the first film. The method includes removing at least part of the second film through the hole. The method includes burying a third interconnect through the hole in a space formed by removing the second film. The method includes forming a resistance change film on an inner surface of the hole. The method includes removing a portion of the resistance change film placed on a bottom surface of the hole and a portion of the first film in a directly overlying region of the hole. The method includes forming a fourth interconnect in the hole and connecting the fourth interconnect to a second end of the semiconductor member.

(First Embodiment)

First, a first embodiment is described.

FIG. 1 is a sectional view showing a memory device according to the embodiment.

Figure 2:
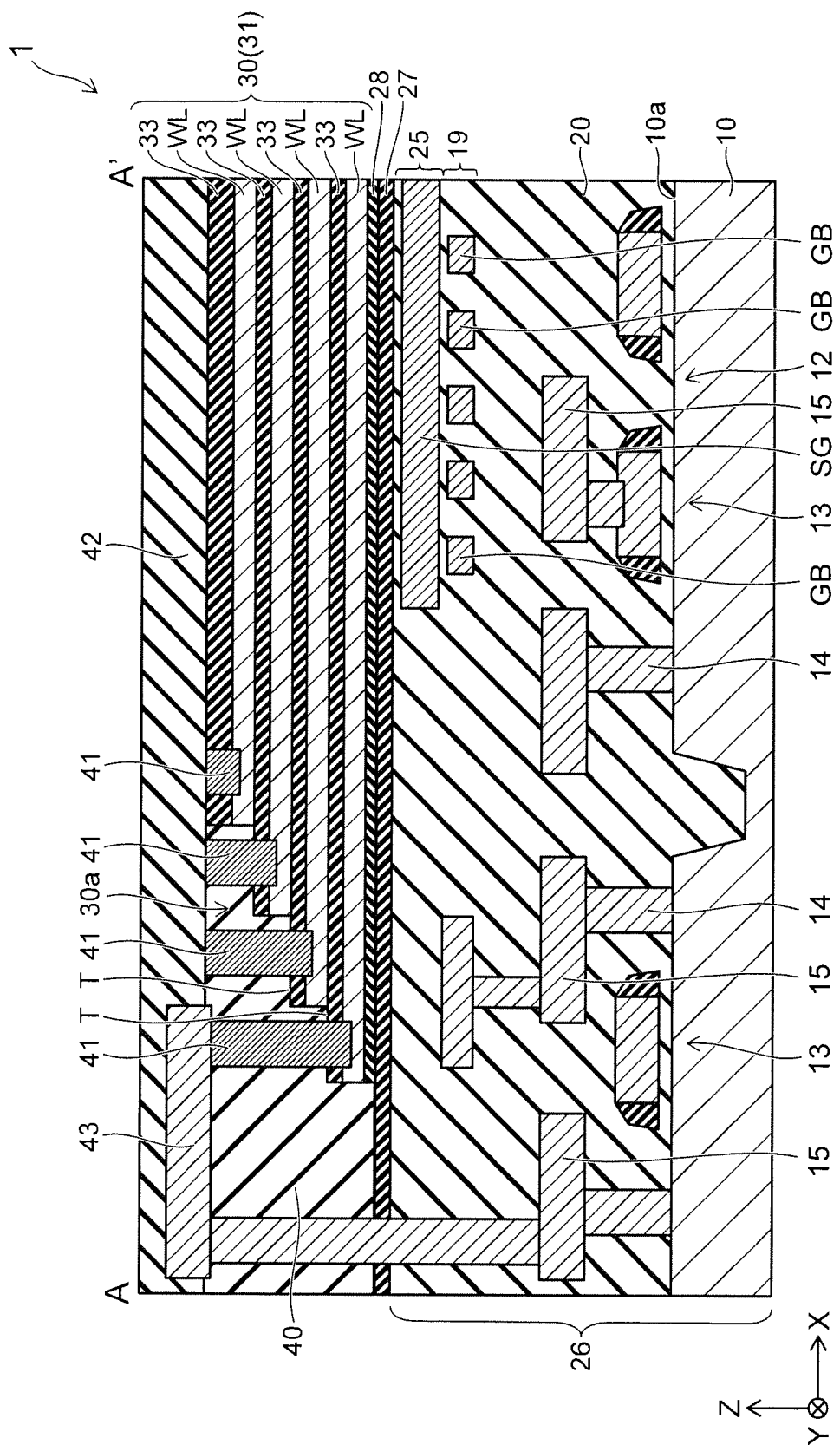
FIG. 2 is a sectional view taken along line A-A' shown in FIG. 1.

FIG. 2 is a sectional view taken along line A-A' shown in FIG. 1.

Figure 3:
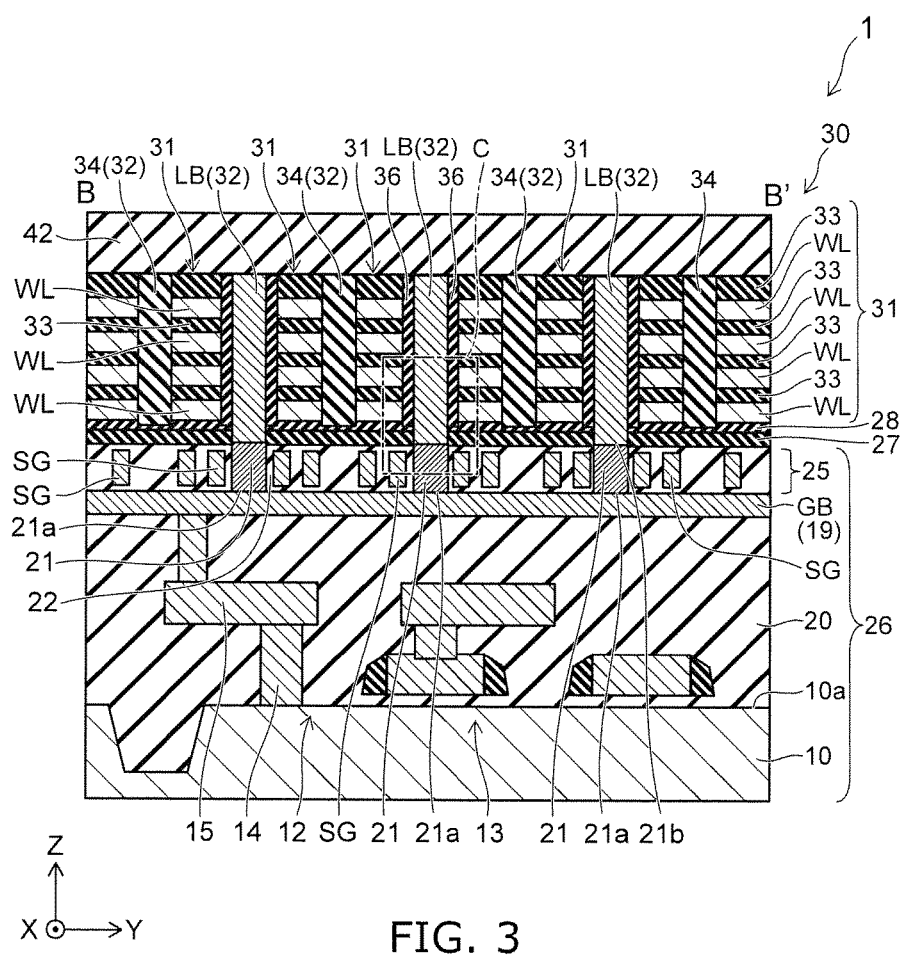
FIG. 3 is a sectional view taken along line B-B' shown in FIG. 1.

FIG. 3 is a sectional view taken along line B-B' shown in FIG. 1.

Figure 4:
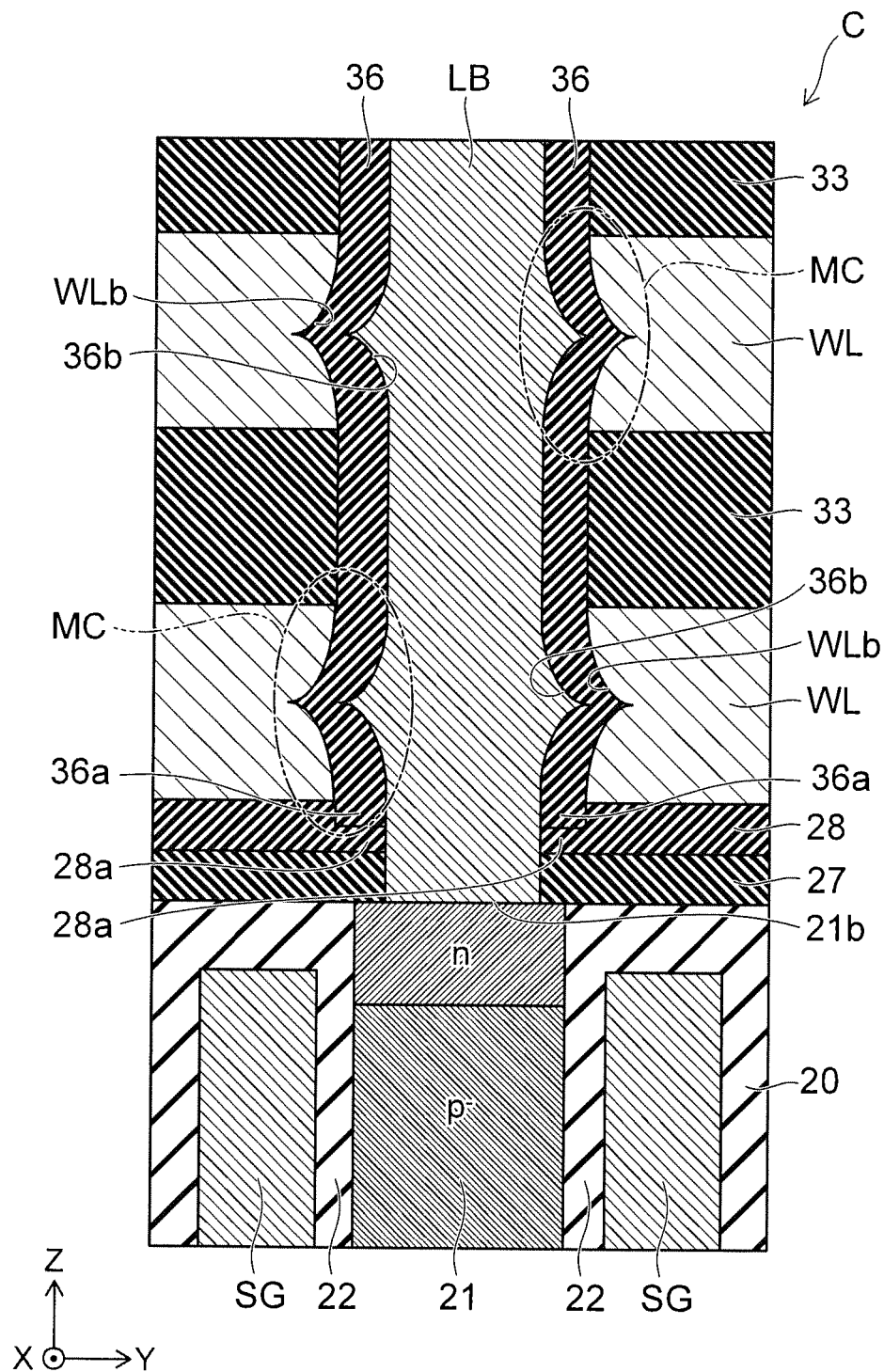
FIG. 4 is a partially enlarged sectional view showing a region C of FIG. 3.

FIG. 4 is a partially enlarged sectional view showing the region C of FIG. 3.

The figures are schematic, and do not necessarily depict the actual product in an accurate manner. For instance, for clarity of illustration, the depicted components are fewer and larger than in the actual product. The figures are not necessarily consistent in size ratio of components.

As shown in FIGS. 1 to 3, the memory device 1 according to the embodiment includes a silicon substrate 10. The silicon substrate 10 is formed from e.g. silicon monocrystal. An interlayer insulating film 20 made of e.g. silicon oxide (SiO) is provided on the silicon substrate 10.

In the following, for convenience of description, an XYZ orthogonal coordinate system is adopted in this specification. The directions parallel to the upper surface 10a of the silicon substrate 10 and orthogonal to each other are referred to as "X-direction" and "Y-direction". The direction perpendicular to the upper surface 10a of the silicon substrate 10 is referred to as "Z-direction". In the Z-direction, the direction from the silicon substrate 10 toward the interlayer insulating film 20 is referred to as "upper", and the opposite direction is referred to as "lower". However, these expressions are used for convenience, and irrelevant to the direction of gravity.

A circuit 12 is formed in an upper portion of the silicon substrate 10, i.e., a portion including the upper surface 10a, and in the interlayer insulating film 20. The circuit 12 includes e.g. a CMOS transistor 13, a contact 14, and an interconnect 15.

A plurality of global bit lines GB are provided in an upper part of the interlayer insulating film 20. The global bit lines GB extend in the Y-direction and are arranged periodically along the X-direction. The plurality of global bit lines GB are placed on the same XY-plane. The plurality of global bit lines GB constitute an interconnect layer 19 in conjunction with the portion of the interlayer insulating film 20 placed between the global bit lines GB.

A plurality of silicon members 21 are provided on each global bit line GB and arranged in a row along the Y-direction. Each silicon member 21 is shaped like a quadrangular pillar extending in the Z-direction. In the memory device 1 as a whole, the plurality of silicon members 21 are arranged in e.g. a staggered arrangement on the XY-plane. For instance, a generally square shape is formed by linking the centers of four silicon members 21 adjacent to one another. The silicon member 21 is formed from semiconductor silicon (Si). The conductivity type of its lower part and upper part is e.g. n-type. The conductivity type of the middle part sandwiched between the lower part and the upper part is e.g. p⁻-type, i-type, or n⁻-type. The lower end 21a of each silicon member 21 is connected to the global bit line GB.

Select gate lines SG extending in the X-direction are provided on both Y-direction sides of the silicon member 21. That is, two select gate lines SG are placed between two silicon members 21 adjacent in the Y-direction. The select gate line SG is formed from e.g. silicon. The lower end of the select gate line SG is located above the lower end of the silicon member 21. The upper end of the select gate line SG is located below the upper end of the silicon member 21. That is, in the Z-direction, the select gate line SG is shorter than the silicon member 21. A gate insulating film 22 made of e.g. silicon oxide is provided between the silicon member 21 and the select gate line SG.

A thin film transistor (TFT) is configured via the gate insulating film 22 for each intersection of each silicon member 21 and each select gate line SG. An interconnect layer 25 is configured from a plurality of silicon members 21, the gate insulating film 22, a plurality of select gate lines SG, and a portion of the interlayer insulating film 20 placed therebetween. The interconnect layer 25 is placed on the interconnect layer 19.

A barrier film 27 and a stopper film 28 are provided on the interconnect layer 25. The barrier film 27 is formed from e.g. silicon oxide. The stopper film 28 is formed from e.g. metal oxide such as titanium oxide (TiO) or aluminum oxide (AlO).

A stacked body 30 is provided on the stopper film 28. In the stacked body 30, a plurality of word line structural bodies 31 and local bit line structural bodies 32 are arranged alternately along the Y-direction. The word line structural body 31 and the local bit line structural body 32 have a generally plate-like shape extending along the XZ-plane.

In the word line structural body 31, word lines WL and interconnect-to-interconnect insulating films 33 are stacked alternately along the Z-direction. The word line WL and the interconnect-to-interconnect insulating film 33 have a generally strip-like shape extending in the X-direction. The word line WL is formed from e.g. a conductive material containing a metal element such as titanium nitride (TiN). The interconnect-to-interconnect insulating film 33 is formed from e.g. an insulating material such as silicon oxide.

In the local bit line structural body 32, local bit lines LB and insulating members 34 are arranged alternately along the X-direction. The local bit line LB is shaped like a generally circular pillar extending in the Z-direction. The lower end of the local bit line LB penetrates through the stopper film 28 and the barrier film 27, and is brought into contact and connected with the upper end 21b of the silicon member 21. The local bit line LB is formed from e.g. polysilicon. The insulating member 34 has a strip-like shape extending in the Z-direction. The Z-direction length of the insulating member 34 is longest, the X-direction length is next longest, and the Y-direction length is shortest. The insulating member 34 is formed from e.g. silicon oxide.

As viewed in the Z-direction, the arrangement of the local bit lines LB is the same as the arrangement of the silicon members 21. For instance, the local bit lines LB are arranged in a staggered arrangement. For instance, a generally square shape is formed by linking the centers of four local bit lines LB adjacent to one another.

A resistance change film 36 is provided on the side surface of the local bit line LB. The resistance change film 36 is shaped like a tube extending in the Z-direction. The diameter of the resistance change film 36 is larger than the thickness, i.e., the Y-direction length, of the insulating member 34. Part of the resistance change film 36 is placed between one local bit line LB and a plurality of word lines WL arranged along the Z-direction. The resistance change film 36 is a film in which the electrical resistance value is changed by the voltage or current applied thereto. The resistance change film 36 is formed from e.g. metal oxide such as hafnium oxide (HfO). For instance, when a voltage of prescribed polarity is applied to the resistance change film 36, a filament is formed in the film, and the resistance value decreases. When a voltage of opposite polarity is applied, part of the filament vanishes, and the resistance value increases.

As shown in FIG. 4, the barrier film 27 and the stopper film 28 are placed between the select gate line SG and the word line WL, but not interposed between the silicon member 21 and the local bit line LB connected to each other. The lower end 36a of the resistance change film 36 enters the stopper film 28, but does not penetrate therethrough. Thus, the lower end 36a is placed in the stopper film 28. An end portion 28a of the stopper film 28 is interposed between the silicon member 21 and the lower end 36a of the resistance change film 36. A seam WLb depressed away from the local bit line LB is formed on the surface of the local bit line LB side of the word line WL. A seam 36b depressed away from the local bit line LB is formed on the surface of the local bit line LB side of the resistance change film 36. The seams WLb and 36b annularly surround the local bit line LB.

As shown in FIGS. 1 and 2, an end portion 30a of the stacked body 30 in the X-direction is shaped like a staircase shape in which a terrace T is formed for each word line WL. The end portion 30a is not provided with the local bit line LB, but provided with a strut 37. The strut 37 is provided so as to divide the insulating member 34. For instance, the struts 37 are arranged in a staggered arrangement as viewed in the Z-direction. The strut 37 is shaped like a circular pillar extending in the Z-direction. The diameter of the strut 37 is larger than the diameter of the local bit line LB and the resistance change film 36. The structure of the strut 37 is similar to the structure of the local bit line LB. That is, a resistance change film made of metal oxide such as hafnium oxide is provided around a circular pillar member made of polysilicon. However, the strut 37 does not function as a local bit line LB, and does not form a memory cell MC.

As shown in FIG. 1, in both end portions of the stacked body 30 in the Y-direction, a silicon nitride film 51 is provided on the Y-direction side of the word line WL. That is, the silicon nitride film 51 is placed on the opposite side of the local bit line LB or the strut 37 as viewed from the word line WL placed at the outermost periphery of the stacked body 30. The silicon nitride film 51 is formed from e.g. silicon nitride. Part of the interface 39 between the word line WL and the silicon nitride film 51 is shaped like a circular arc about the local bit line LB or the strut 37. In the portion of the stacked body 30 except the end portion 30a, the Y-direction position of the interface 39 varies along the X-direction with the same pitch as the arrangement pitch of the local bit lines LB arranged in the X-direction.

As shown in FIGS. 1 to 3, an interlayer insulating film 40 is provided around the stacked body 30 on the barrier film 27. The interlayer insulating film 40 covers also the upper surface of the end portion 30a of the stacked body 30. The interlayer insulating film 40 is formed from e.g. silicon oxide. A contact 41 extending in the Z-direction is provided in the interlayer insulating film 40. The lower end of the contact 41 is connected to the word line WL in the terrace T.

An upper insulating film 42 is provided on the stacked body 30 and the interlayer insulating film 40. An upper interconnect 43 is provided in the upper insulating film 42. The upper interconnect 43 connects the contact 41 to the circuit 12.

In the memory device 1, a memory cell MC via the resistance change film 36 is formed for each intersection of the local bit line LB and the word line WL. Thus, memory cells MC are arranged three-dimensionally in the memory device 1. A select transistor is configured via the gate insulating film 22 for each intersection of the silicon member 21 and each select gate line SG.

When a particular memory cell MC is to be selected in the memory device 1, one global bit line GB is first selected. Next, by selecting one select gate line SG or two select gate lines SG sandwiching one silicon member 21, this silicon member 21 is made electrically continuous. Thus, one local bit line LB is connected to the selected global bit line GB. On the other hand, one word line WL is selected. Thus, one memory cell MC formed between the selected local bit line LB and the selected word line WL can be selected. Then, a prescribed voltage is applied between the selected global bit line GB and the selected word line WL to change the resistance value of the resistance change film 36. Thus, data is stored in the memory cell MC.

Next, a method for manufacturing the memory device according to the embodiment is described.

The following description is focused on a method for forming the portion of the stacked body 30 except the end portion 30a.

FIGS. 5A to 14B show a method for manufacturing the memory device according to the embodiment.

Figure 5A:
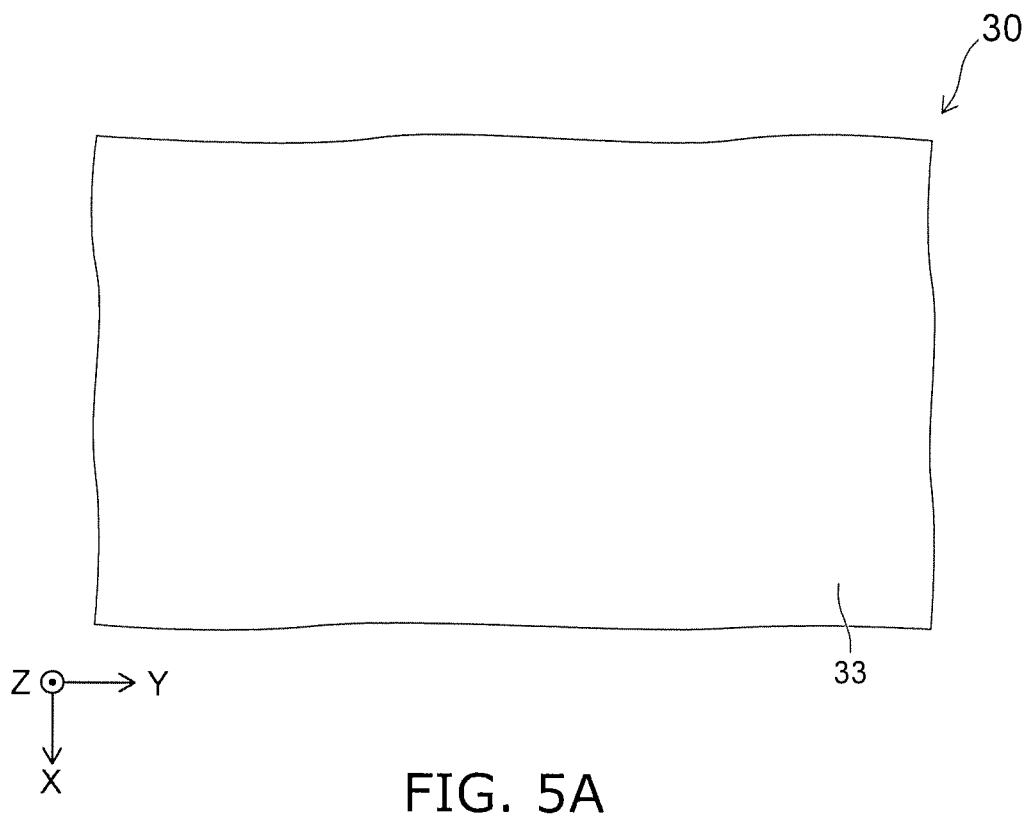
FIGS. 5A to 14B show a method for manufacturing the memory device according to the first embodiment.
Figure 5B:
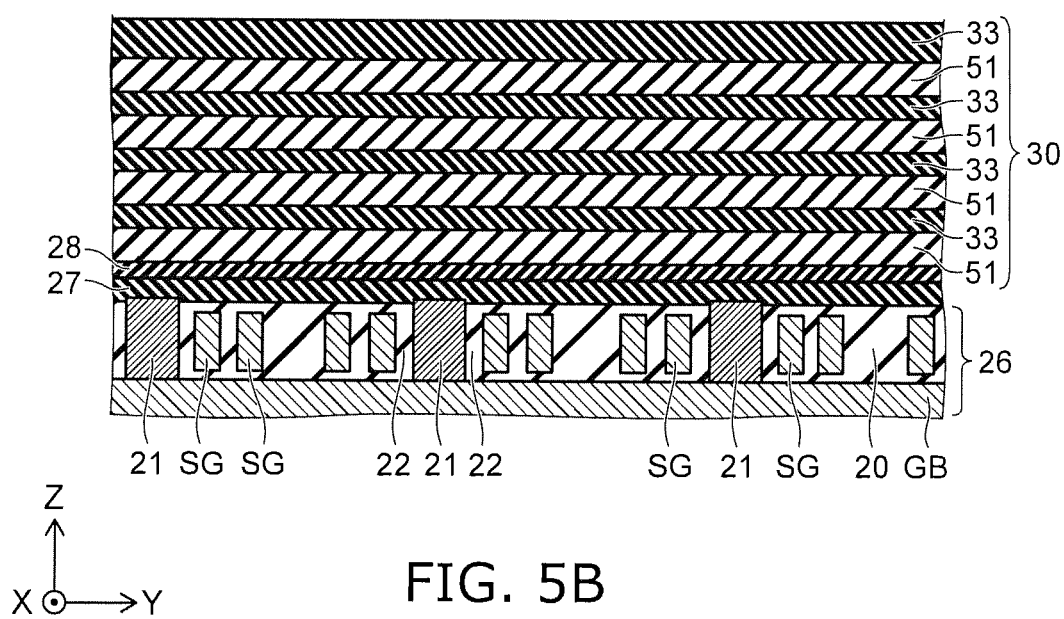

FIG. 5A is a plan view, and FIG. 5B is a sectional view thereof. This also applies similarly to FIGS. 6A to 14B.

First, as shown in FIGS. 2 and 3, a silicon substrate 10 is prepared. Next, by normal methods, an interlayer insulating film 20 is formed on the silicon substrate 10, and a circuit 12 is formed in an upper portion of the silicon substrate 10 and in the interlayer insulating film 20. Next, a plurality of global bit lines GB extending in the Y-direction are formed to form an interconnect layer 19. Next, silicon members 21 are formed on the interconnect layer 19. The silicon member 21 extends in the Z-direction. The lower end 21a of the silicon member 21 is connected to the global bit line GB. The silicon members 21 are arranged in a staggered arrangement. A gate insulating film 22 is formed on the side surface facing the Y-direction of the silicon member 21. A select gate line SG extending in the X-direction is formed on the side surface of the gate insulating film 22. An interlayer insulating film 20 is further formed so as to cover the select gate line SG. Thus, an interconnect layer 25 is formed. Accordingly, an intermediate structural body 26 is fabricated.

Next, as shown in FIGS. 5A and 5B, silicon oxide is deposited to form a barrier film 27 on the intermediate structural body 26. Next, metal oxide such as titanium oxide or aluminum oxide is deposited to form a stopper film 28. Next, silicon nitride films 51 made of silicon nitride (SiN) and interconnect-to-interconnect insulating films 33 made of silicon oxide (SiO) are alternately stacked to form a stacked body 30. At this time, the thickness of the uppermost interconnect-to-interconnect insulating film 33 is made thicker than that of the other interconnect-to-interconnect insulating films 33.

Next, as shown in FIG. 2, the X-direction end portion 30a of the stacked body 30 is processed into a staircase shape to form a terrace T for each silicon nitride film 51. Next, silicon oxide is deposited on the entire surface, and planarization processing such as CMP (chemical mechanical polishing) is performed to form an interlayer insulating film 40 around the stacked body 30.

Figure 6A:
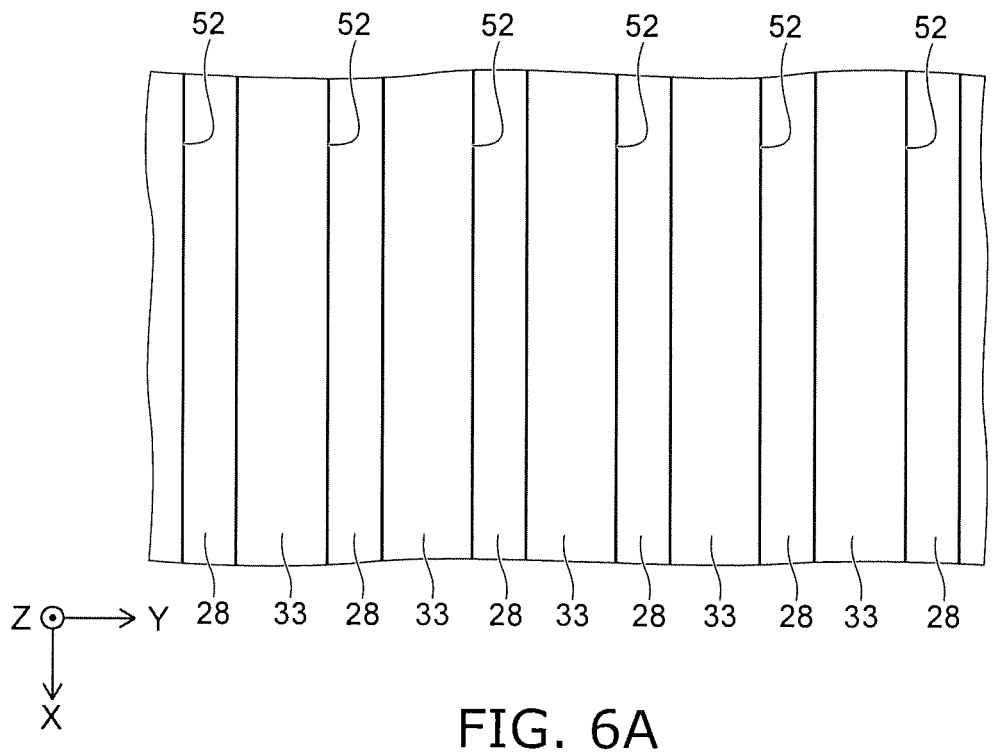
Figure 6B:
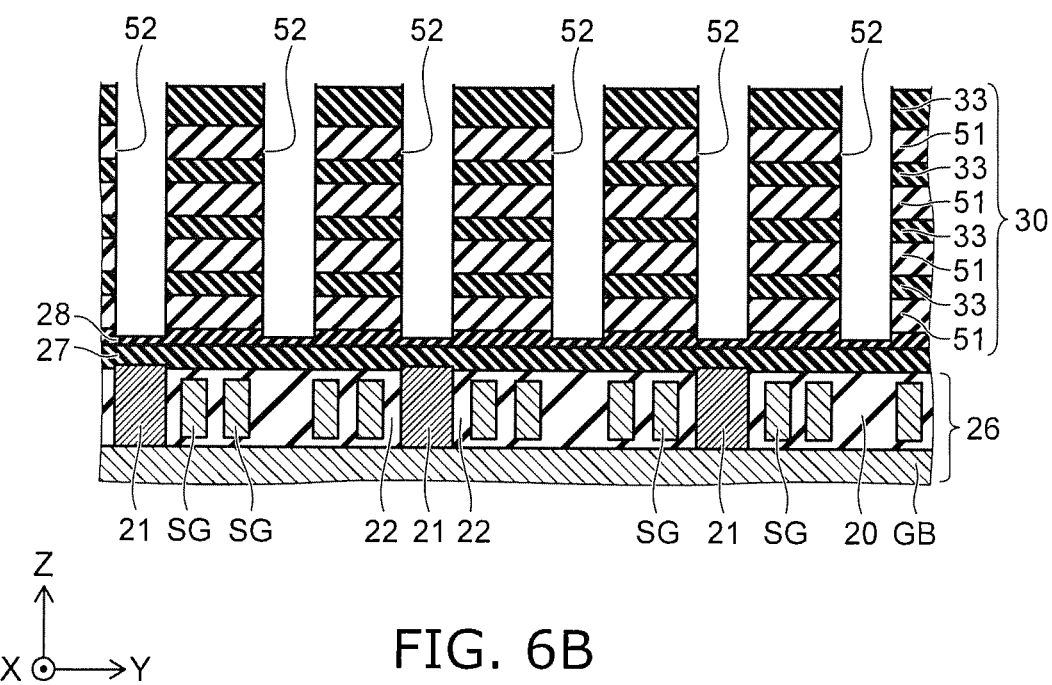

Next, as shown in FIGS. 6A and 6B, the stopper film 28 is used as an etching stopper to perform anisotropic etching such as the RIE (reactive ion etching) method. Thus, a plurality of trenches 52 extending in the X-direction are formed in the stacked body 30 and the interlayer insulating film 40. The trench 52 is formed in the region including the directly overlying region of the silicon member 21. The trench 52 penetrates through the stacked body 30. The lower end of the trench 52 enters the upper part of the stopper film 28. However, the trench 52 does not penetrate through the stopper film 28. This etching removes only silicon oxide and silicon nitride, and thus is relatively easy. For instance, this etching can be performed by using a mask containing carbon (C) or silicon (Si).

Figure 7A:
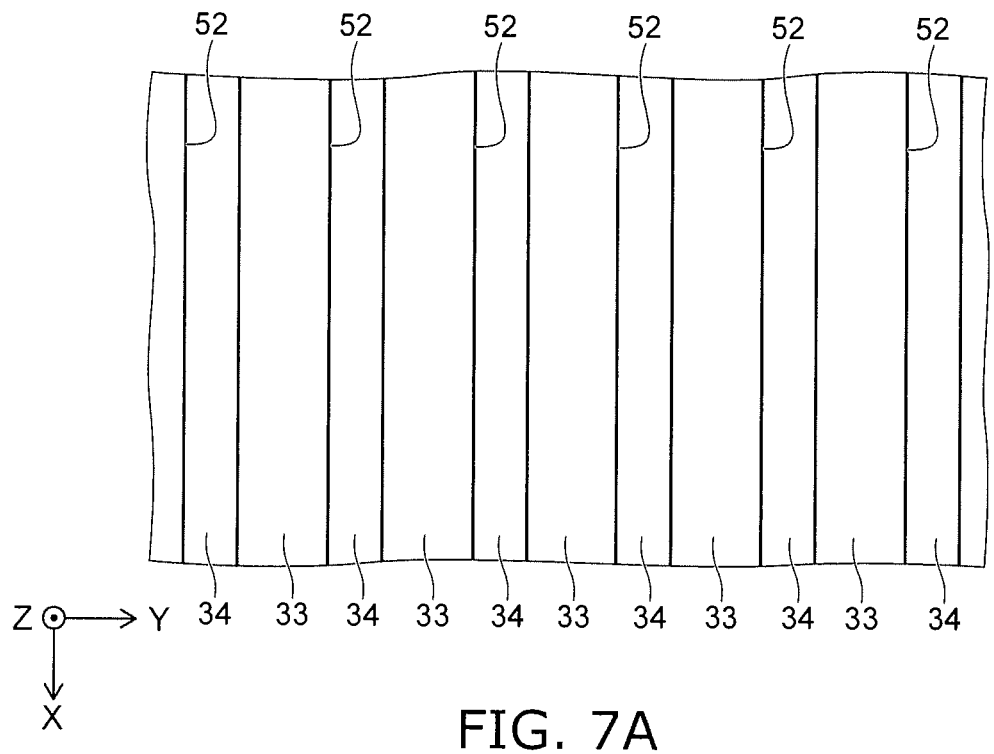
Figure 7B:
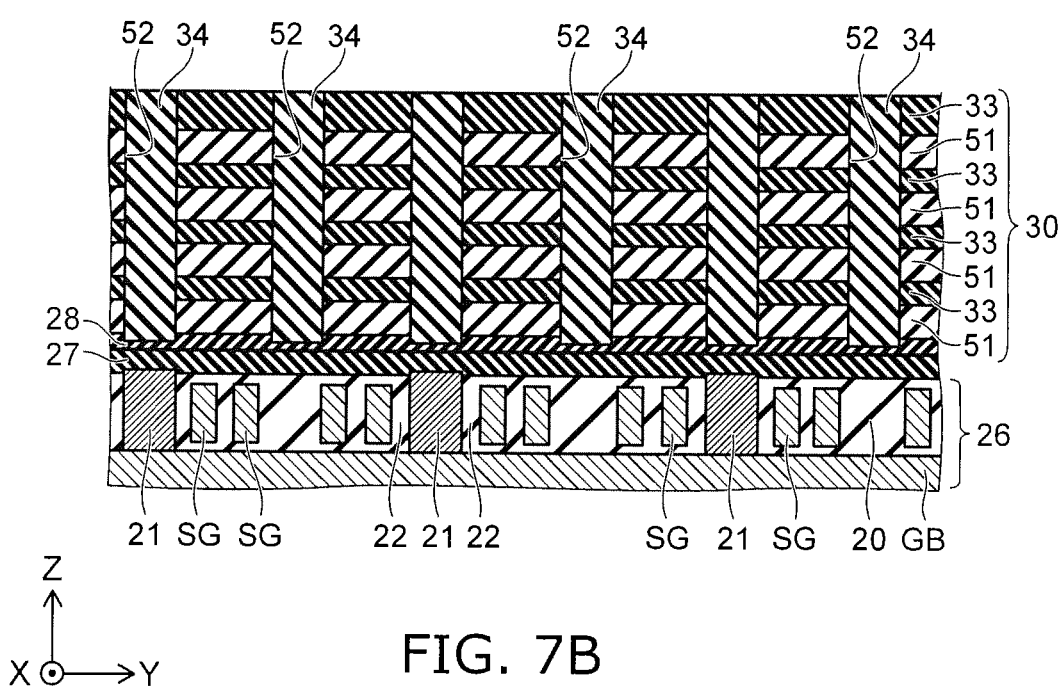

Next, as shown in FIGS. 7A and 7B, silicon oxide is deposited, and planarization processing such as CMP is performed. Thus, an insulating member 34 is buried in the trench 52.

Figure 8A:
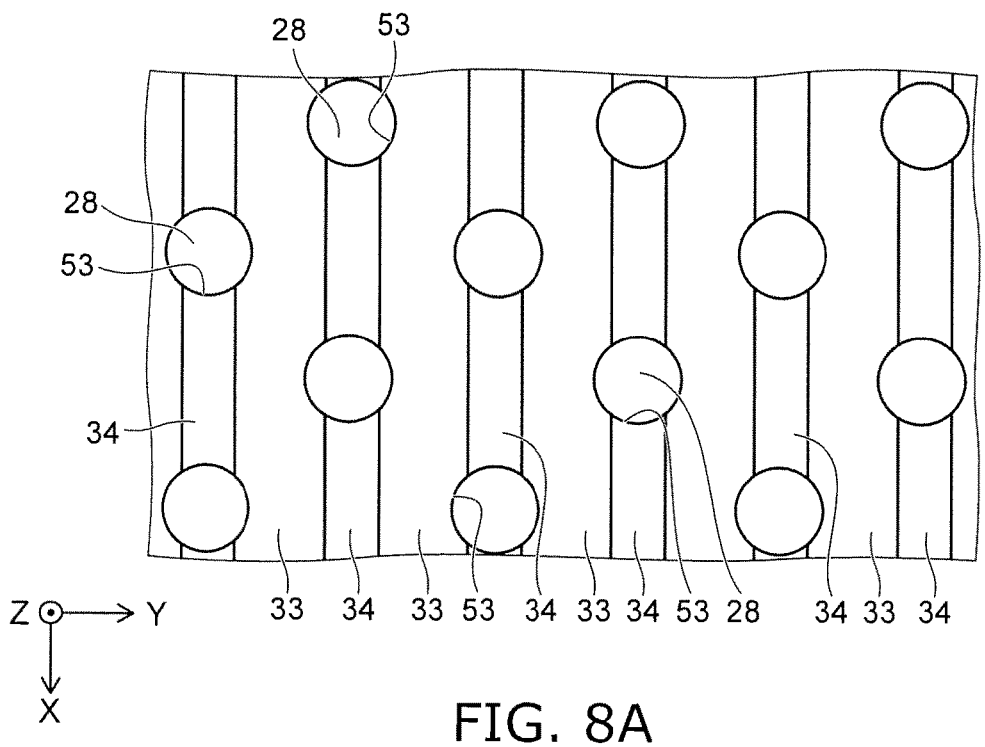
Figure 8B:
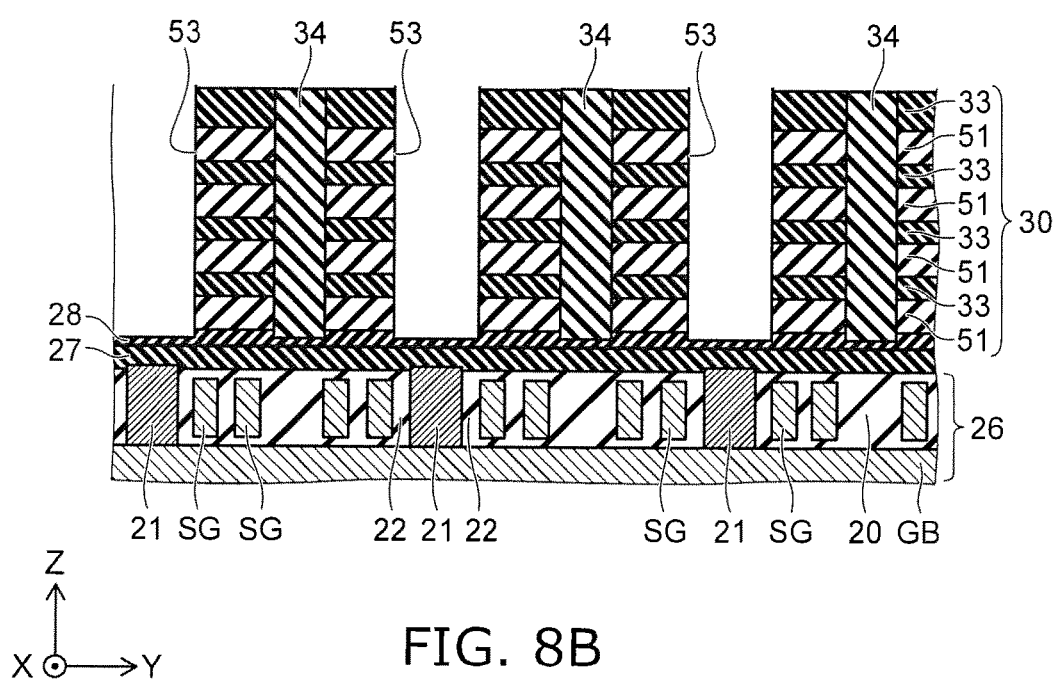

Next, as shown in FIGS. 8A and 8B, the stopper film 28 is used as an etching stopper to perform anisotropic etching such as the RIE method. Thus, a hole 53 is formed in the directly overlying region of the silicon member 21 in the stacked body 30. On the other hand, a hole 54 (see FIG. 1) is formed in the end portion 30a of the stacked body 30 and the interlayer insulating film 40. The diameter of the hole 54 is made larger than the diameter of the hole 53. The hole 54 divides the insulating member 34, but is not located in the directly overlying region of the silicon member 21.

The holes 53 and 54 penetrate through the stacked body 30 to the stopper film 28, but do not penetrate through the stopper film 28. Thus, the bottom surface of the hole 53 and the bottom surface of the hole 54 are located in the stopper film 28. The diameter of the holes 53 and 54 is made larger than the Y-direction length of the insulating member 34. Thus, the holes 53 and 54 divide the insulating member 34 in the X-direction, and remove part of the silicon nitride film 51 and the interconnect-to-interconnect insulating film 33 on both Y-direction sides of the insulating member 34. As a result, the silicon nitride film 51 and the interconnect-to-interconnect insulating film 33 are exposed at the inner surface of the holes 53 and 54.

Figure 9A:
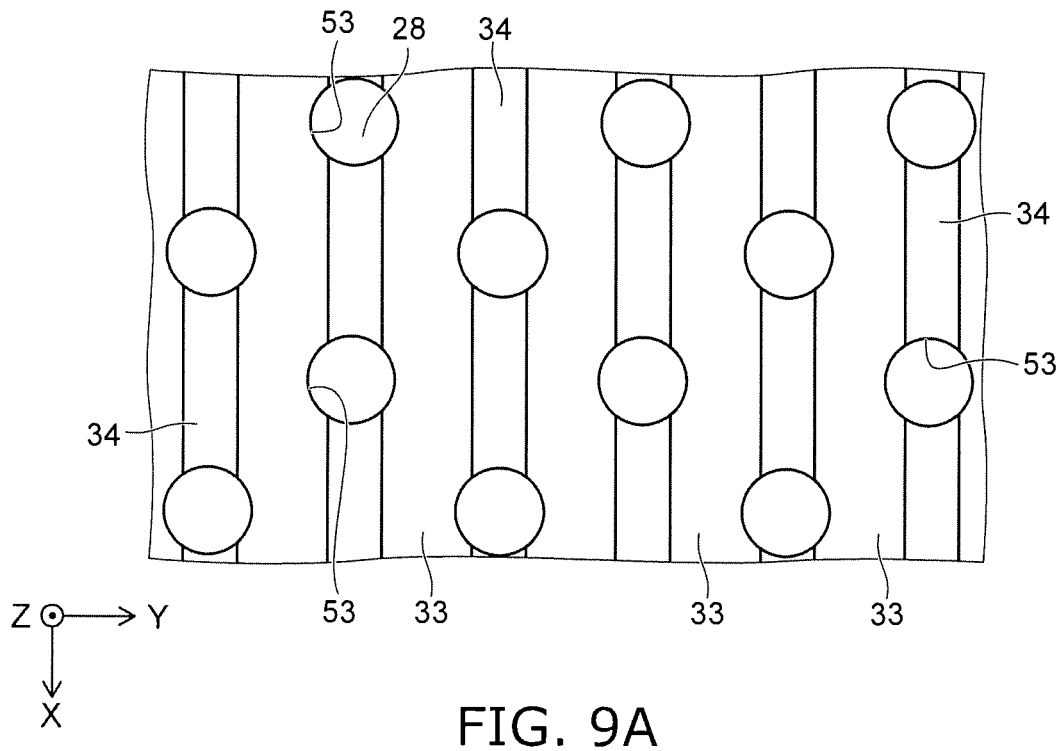
Figure 9B:
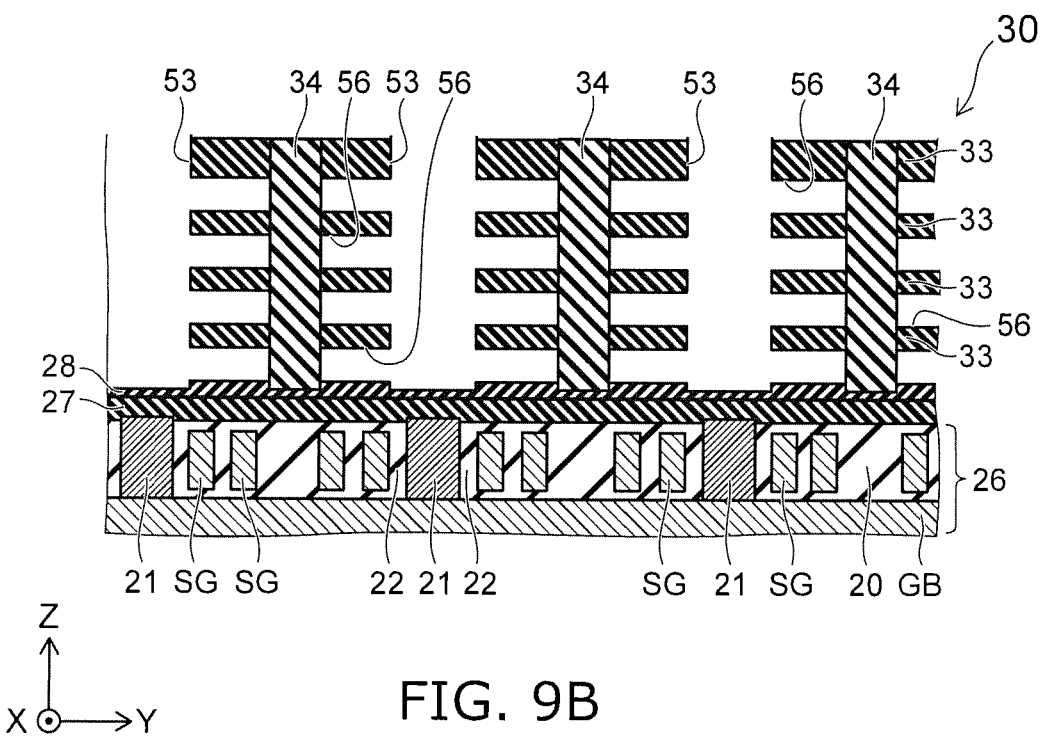

Next, as shown in FIGS. 9A and 9B, isotropic etching is performed through the hole 53 and the hole 54. For instance, wet etching is performed using hot phosphoric acid (hot-$H_3PO_4$) as an etchant. Alternatively, CDE (chemical dry etching) may be performed. Thus, part of the silicon nitride film 51 (see FIG. 8B) is removed, and a space 56 is formed. At this time, the insulating member 34 made of silicon oxide is not removed and functions as a column for supporting the stacked body 30. This can avoid collapse of the stacked body 30.

At this time, the silicon nitride film 51 is removed with the hole 53 and the hole 54 at the center. Thus, the silicon nitride film 51 is completely removed between the holes 53, between the holes 54, and between the hole 53 and the hole 54. However, part of the silicon nitride film 51 may remain in the peripheral part of the stacked body 30. In this case, as shown in FIG. 1, as viewed in the Z-direction, part of the inner surface of the space 56 is shaped like a circular arc about the hole 53 placed at the outermost periphery, and a circular arc about the hole 54 placed at the outermost periphery. However, the silicon nitride film 51 may be completely removed.

Figure 10A:
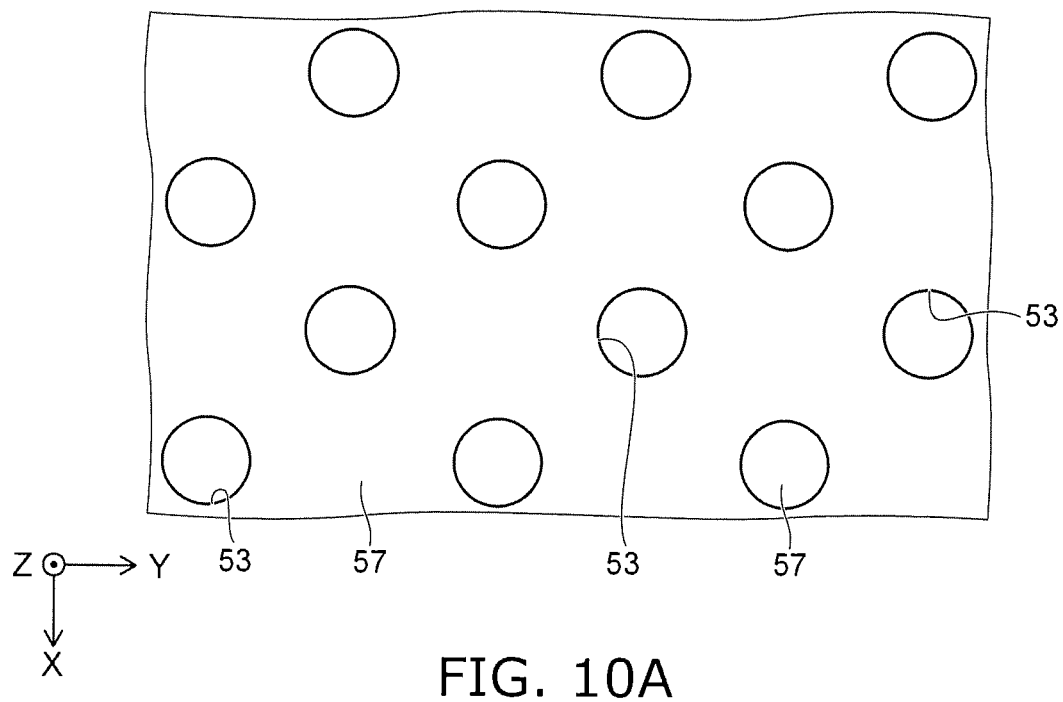
Figure 10B:
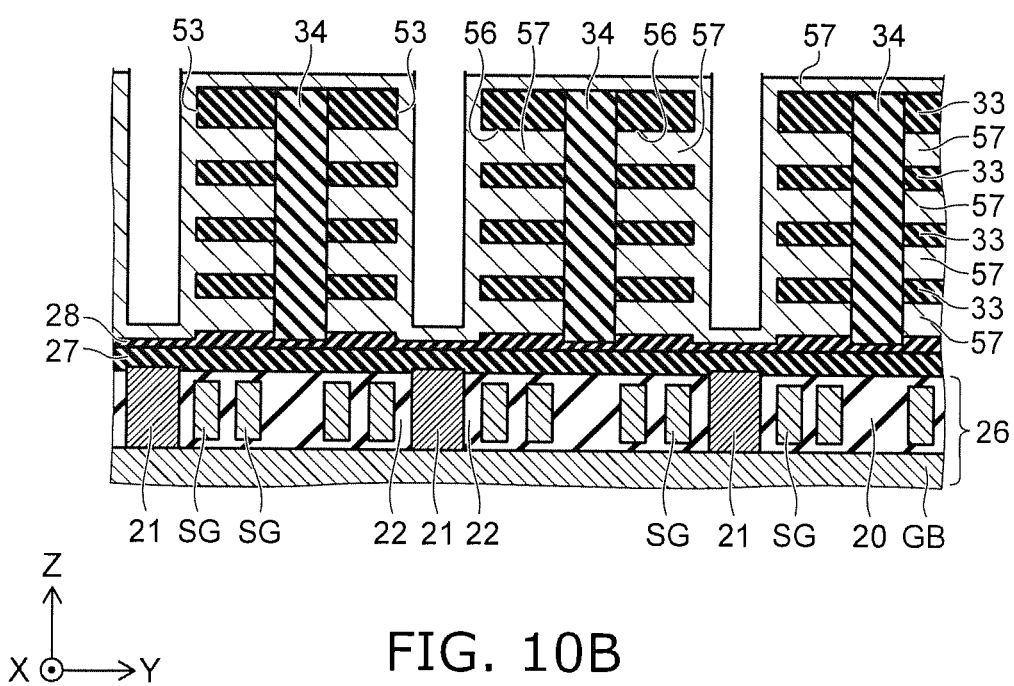

Next, as shown in FIGS. 10A and 10B, a conductive material such as titanium nitride (TiN) is deposited by e.g. the CVD (chemical vapor deposition) method to form a conductive layer 57. The conductive layer 57 enters also the space 56 through the hole 53 and the hole 54. At this time, the conductive layer 57 grows from the upper surface, the lower surface, and the back surface of the space 56. Thus, a seam depressed toward the back of the space 56 is formed near the boundary between the space 56 and the hole 53 and near the boundary between the space 56 and the hole 54. The seam is not depicted in FIGS. 10A and 10B.

Figure 11A:
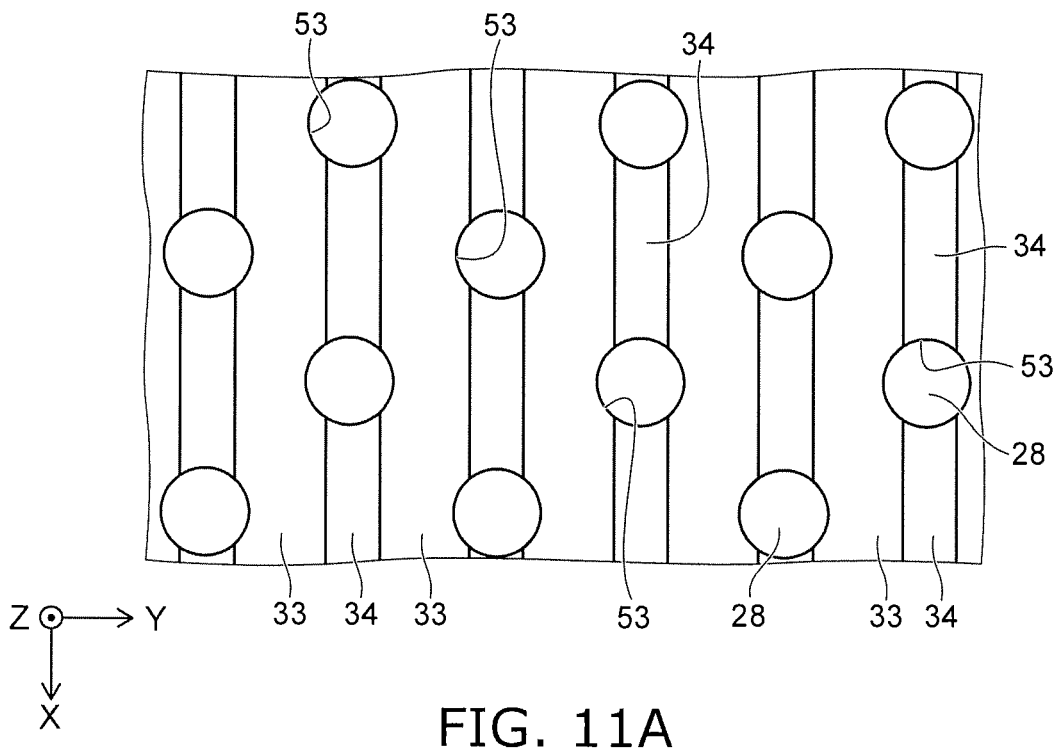
Figure 11B:
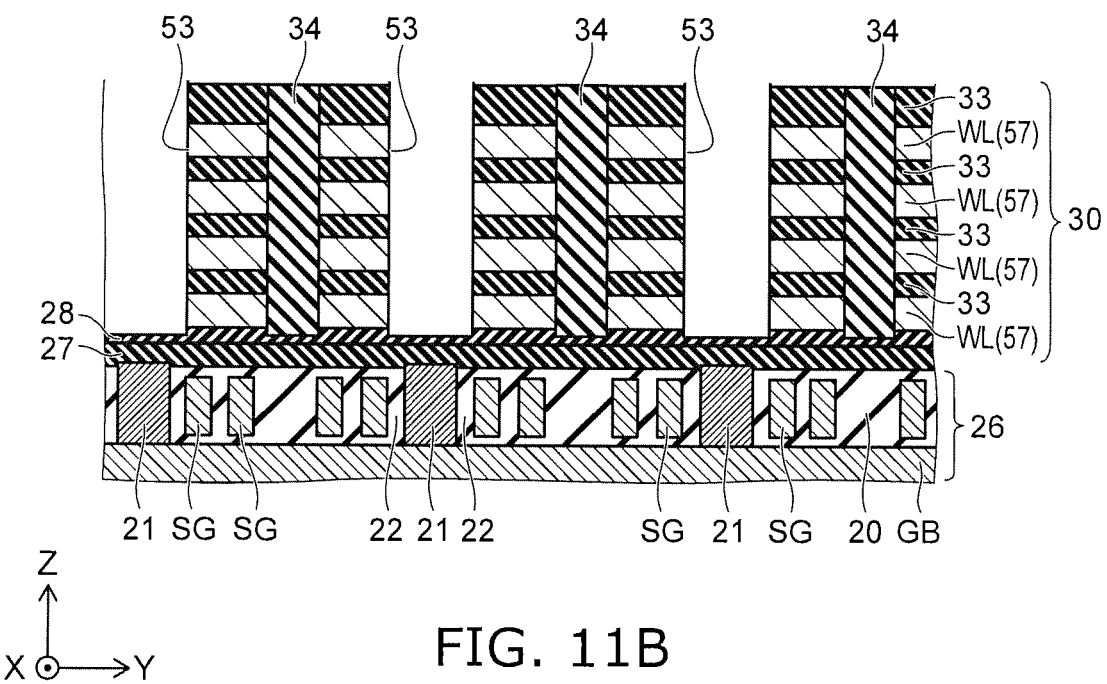

Next, as shown in FIGS. 11A and 11B, dry etching or wet etching such as the RIE method or the CDE method is performed. Thus, the conductive layer 57 is recessed to remove the portion of the conductive layer 57 formed in the hole 53 and the hole 54. Accordingly, the conductive layer 57 remains in the space 56 and constitutes a word line WL. At this time, as shown in FIG. 4, the seam formed in the conductive layer 57 remains as a seam WLb of the word line WL. As shown in FIG. 1, the arc-shaped inner surface of the space 56 constitutes an interface 39 between the silicon nitride film 51 and the word line WL.

Figure 12A:
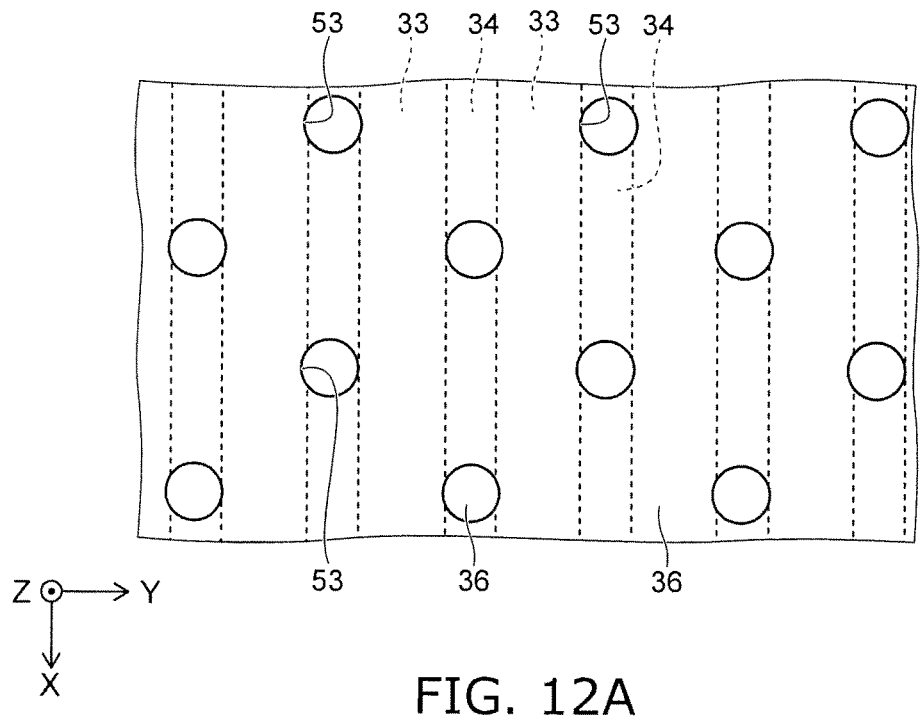
Figure 12B:
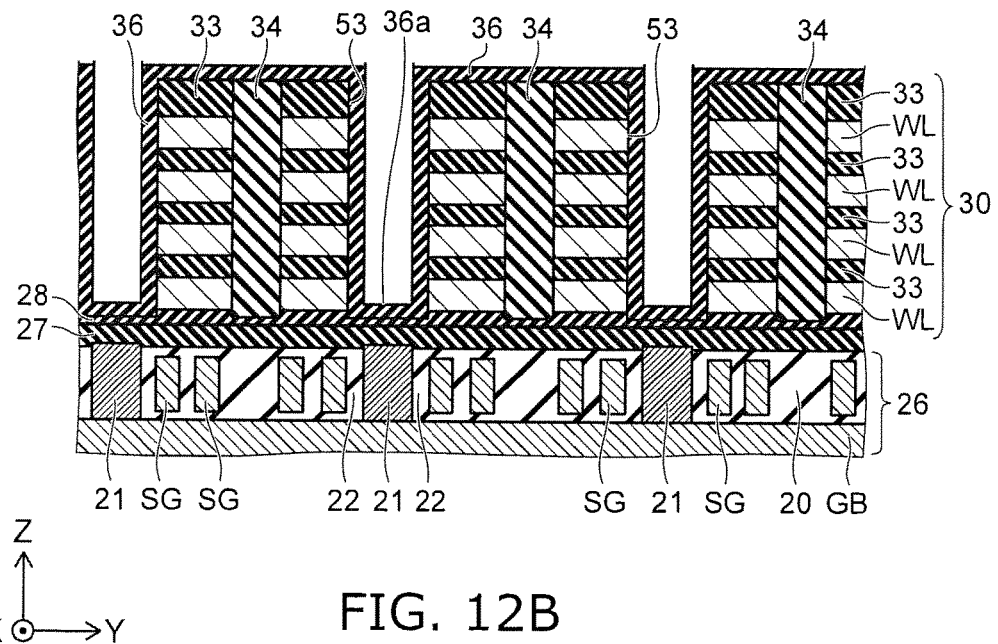

Next, as shown in FIGS. 12A and 12B, metal oxide such as hafnium oxide (e.g., $HfO_2$) is deposited on the entire surface to form a resistance change film 36. The resistance change film 36 is formed also on the inner surface of the hole 53 and the inner surface of the hole 54. At this time, as shown in FIG. 4, a seam 36b is formed in the portion of the resistance change film 36 covering the seam WLb of the word line WL. The upper part of the stopper film 28 has been removed at the bottom surface of the holes 53 and 54. Thus, the lower end 36a of the resistance change film 36 is placed in the stopper film 28.

Figure 13A:
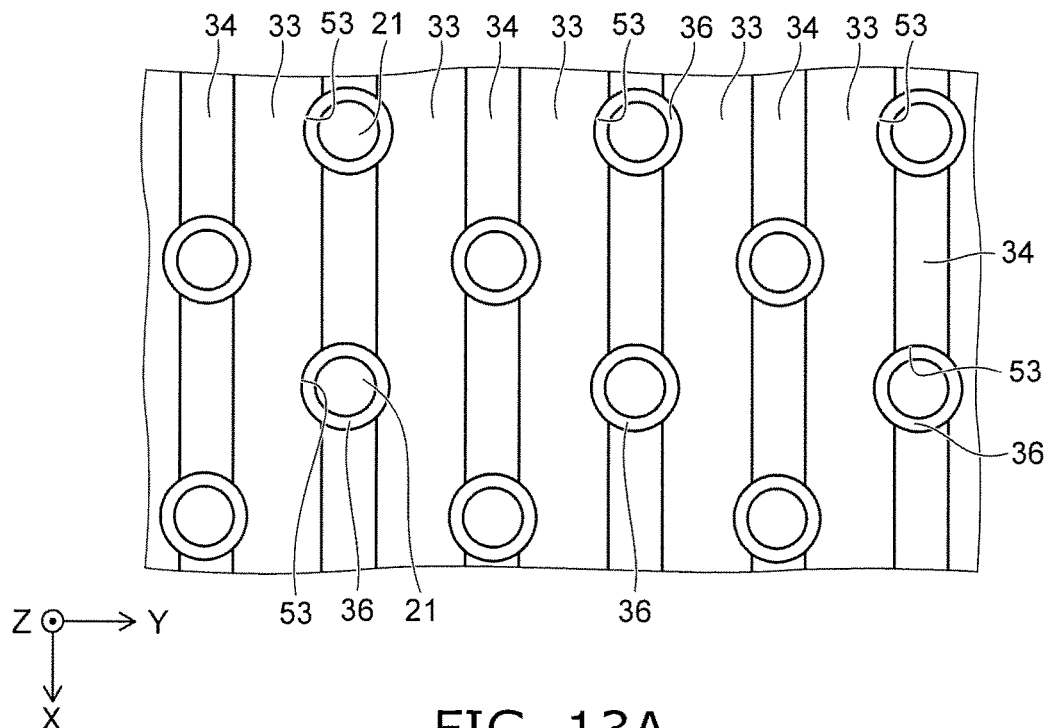
Figure 13B:
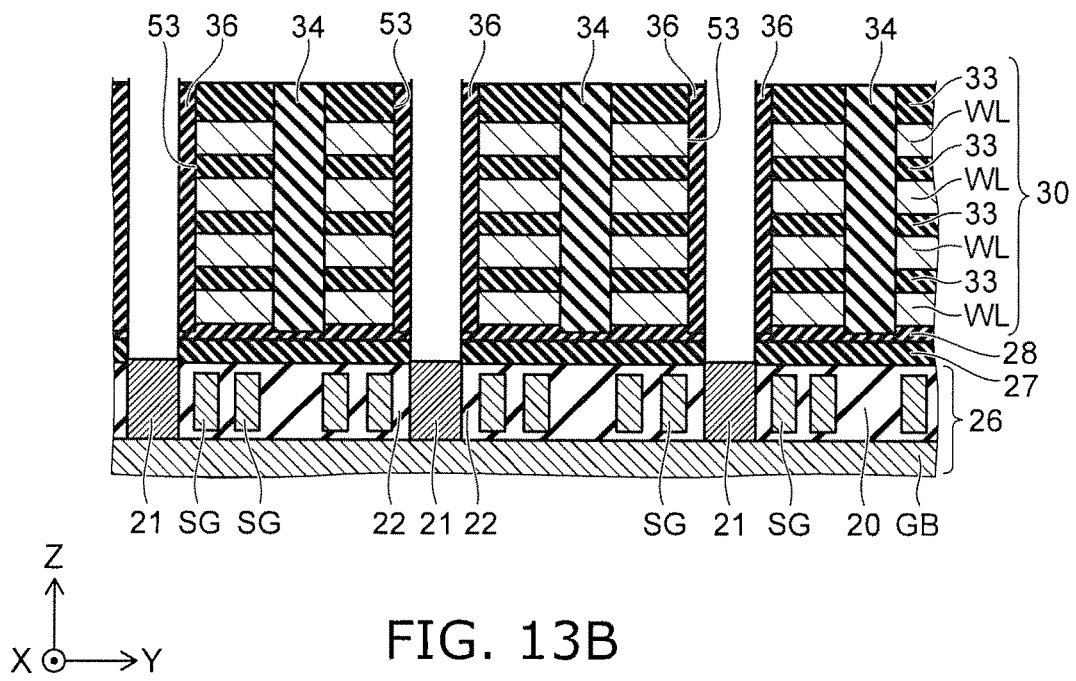

Next, as shown in FIGS. 13A and 13B, anisotropic etching such as RIE is performed. Thus, the resistance change film 36 is removed from the bottom surface of the hole 53 and the hole 54, the remaining part of the stopper film 28 is removed, and the barrier film 27 is removed. Accordingly, the stopper film 28 and the barrier film 27 are penetrated, and the silicon member 21 is exposed at the bottom surface of the hole 53. At this time, the resistance change film 36 is removed also from the upper surface of the stacked body 30. As a result, the resistance change film 36 remains like a tube on the inner side surface of the hole 53 and the hole 54.

Figure 14A:
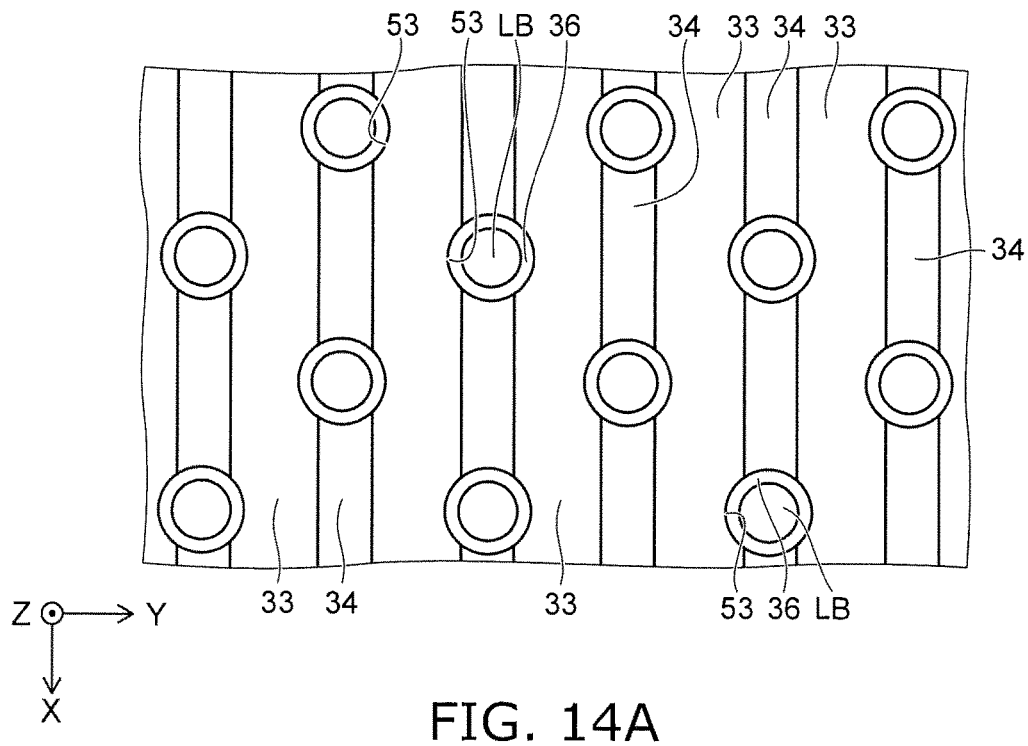
Figure 14B:
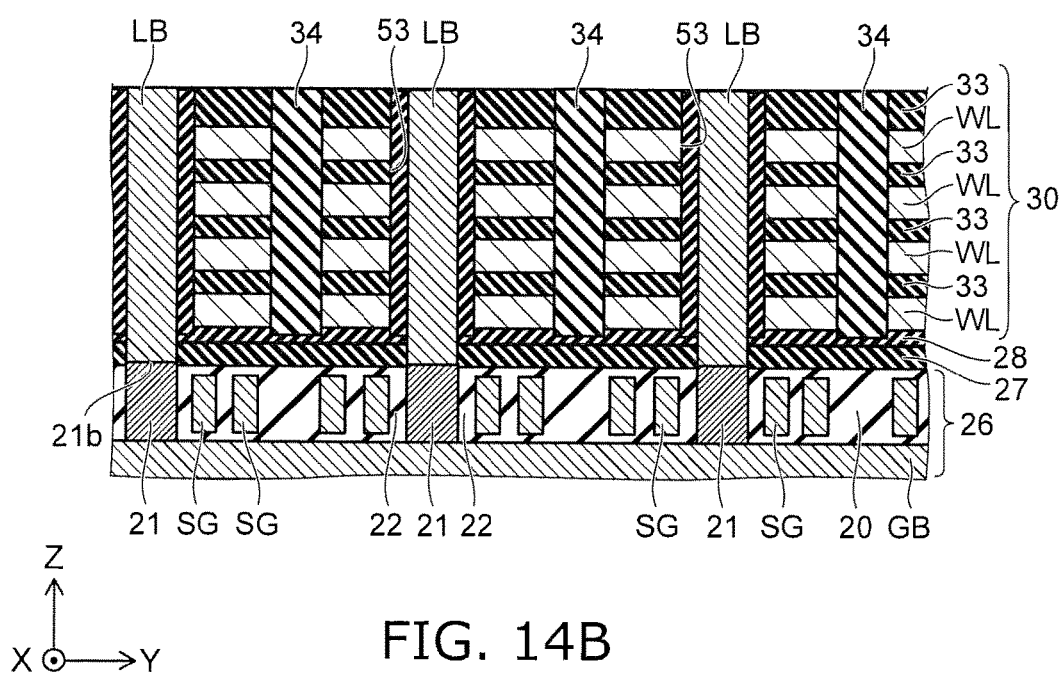

Next, as shown in FIGS. 14A and 14B, silicon is deposited, and planarization processing such as CMP is performed. Thus, a local bit line LB made of polysilicon is formed in the hole 53, and a strut 37 (see FIG. 1) is formed in the hole 54. The lower end of the local bit line LB is brought into contact and connected with the upper end 21b of the silicon member 21.

Next, as shown in FIGS. 1 to 3, a contact 41 is formed in the directly overlying region of the terrace T in the interlayer insulating film 40 and connected to the word line WL. Next, an upper insulating film 42 and an upper interconnect 43 are formed on the interlayer insulating film 40. Thus, the memory device 1 according to the embodiment is manufactured.

Next, the effect of the embodiment is described.

According to the embodiment, in the step shown in FIGS. 5A and 5B, silicon nitride films 51 and interconnect-to-interconnect insulating films 33 are alternately stacked to form a stacked body 30. In the step shown in FIGS. 6A and 6B, trenches 52 are formed in the stacked body 30 to divide the stacked body 30 into the shape of word lines WL. In the step shown in FIGS. 7A and 7B, an insulating member 34 is buried in the trench 52. In the step shown in FIGS. 8A and 8B, holes 53 and the like are formed in the stacked body 30 including the insulating member 34. In the step shown in FIGS. 9A and 9B, the silicon nitride film 51 is removed through the hole 53 and the like to form a space 56. In the steps shown in FIGS. 10A to 11B, a word line WL is buried in the space 56. Thus, according to the embodiment, a plurality of layers of word lines WL can be formed by the replacement method.

As a result, etching for realizing the shape of the word line WL only needs to be performed on the ONON stacked body in which the silicon nitride films 51 made of silicon nitride and the interconnect-to-interconnect insulating films 33 made of silicon oxide are stacked. This is easier than performing etching on the stacked body containing metal elements such as titanium nitride. This can suppress the difficulty of etching even if the number of stacked layers of the word lines WL is increased to enhance the degree of integration of memory cells MC.

In the embodiment, in the steps shown in FIGS. 12A to 13B, a resistance change film 36 is formed on the inner side surface of the hole 53. In the step shown in FIGS. 14A and 14B, a local bit line LB is formed in the hole 53. Thus, the resistance change film 36 and the local bit line LB can be formed in a self-aligned manner.

Thus, the embodiment can easily manufacture a memory device of the stacked type with a large number of stacked layers.

In the example illustrated in the embodiment, titanium nitride (TiN) is used as the material of the word line WL. However, the embodiment is not limited thereto. The material of the word line WL may be e.g. tungsten (W), copper (Cu), cobalt (Co), nickel (Ni), platinum (Pt), gold (Au), aluminum (Al), or silicon (Si), or a compound of these elements.

(First Variation of the First Embodiment)

Next, a first variation of the first embodiment is described.

Figure 15:
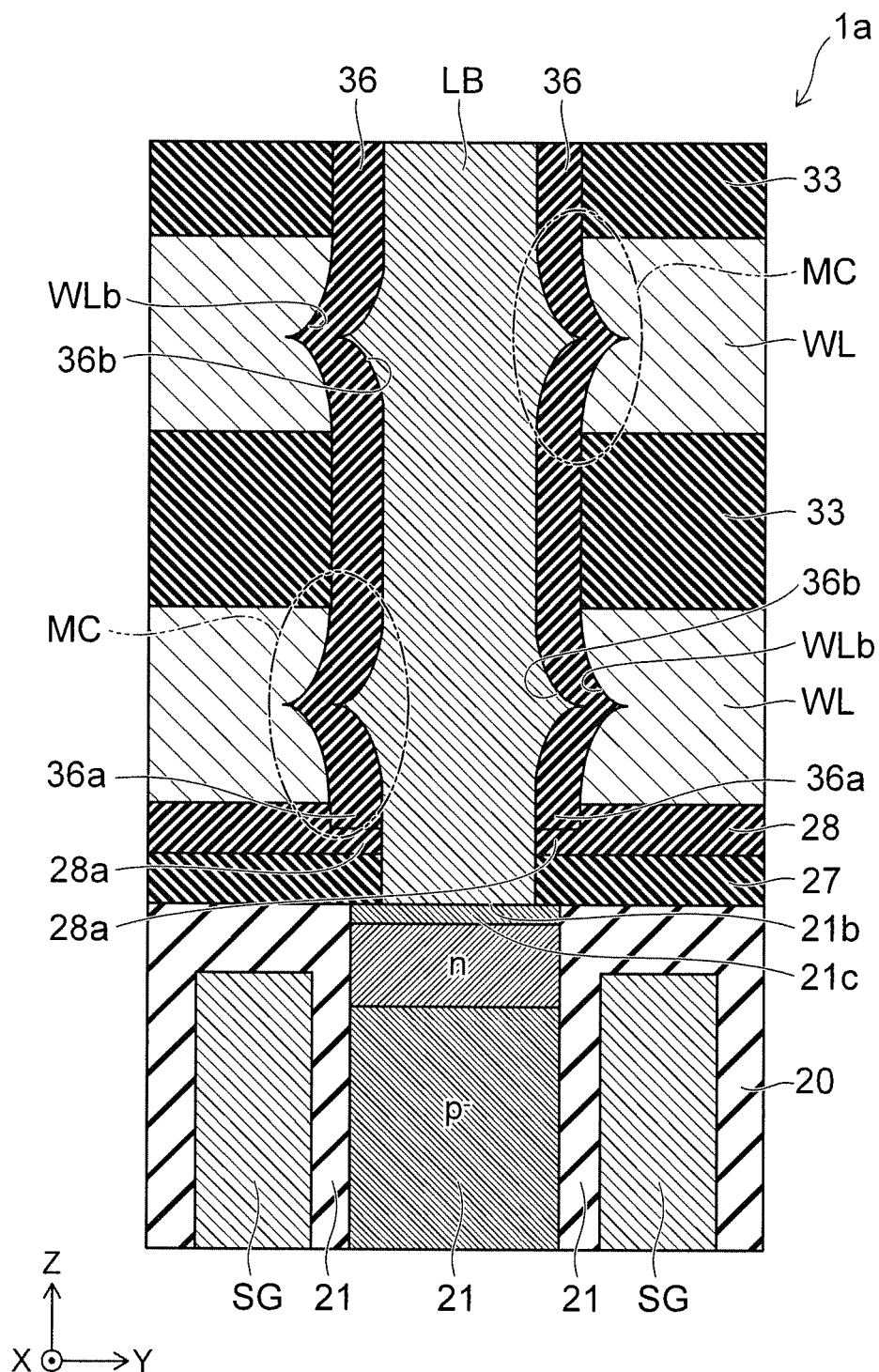
FIG. 15 is a sectional view showing a memory device according to a first variation of the first embodiment.

FIG. 15 is a sectional view showing a memory device according to this variation.

FIG. 15 shows a region corresponding to the region C of FIG. 3.

As shown in FIG. 15, in the memory device 1a according to this variation, a conductive layer 21c is provided at the upper end 21b of the silicon member 21. The conductive layer 21c is formed from e.g. titanium nitride (TiN). Thus, the main part of the silicon member 21 made of polysilicon and the local bit line LB made of polysilicon can be connected with low resistance through the conductive layer 21c. As a result, the interconnect resistance between the global bit line GB and the resistance change film 36 can be reduced, and the memory cell MC can be driven more accurately.

The configuration, operation, manufacturing method, and effect of this variation other than the foregoing are similar to those of the above first embodiment.

(Second Variation of the First Embodiment)

Next, a second variation of the first embodiment is described.

Figure 16:
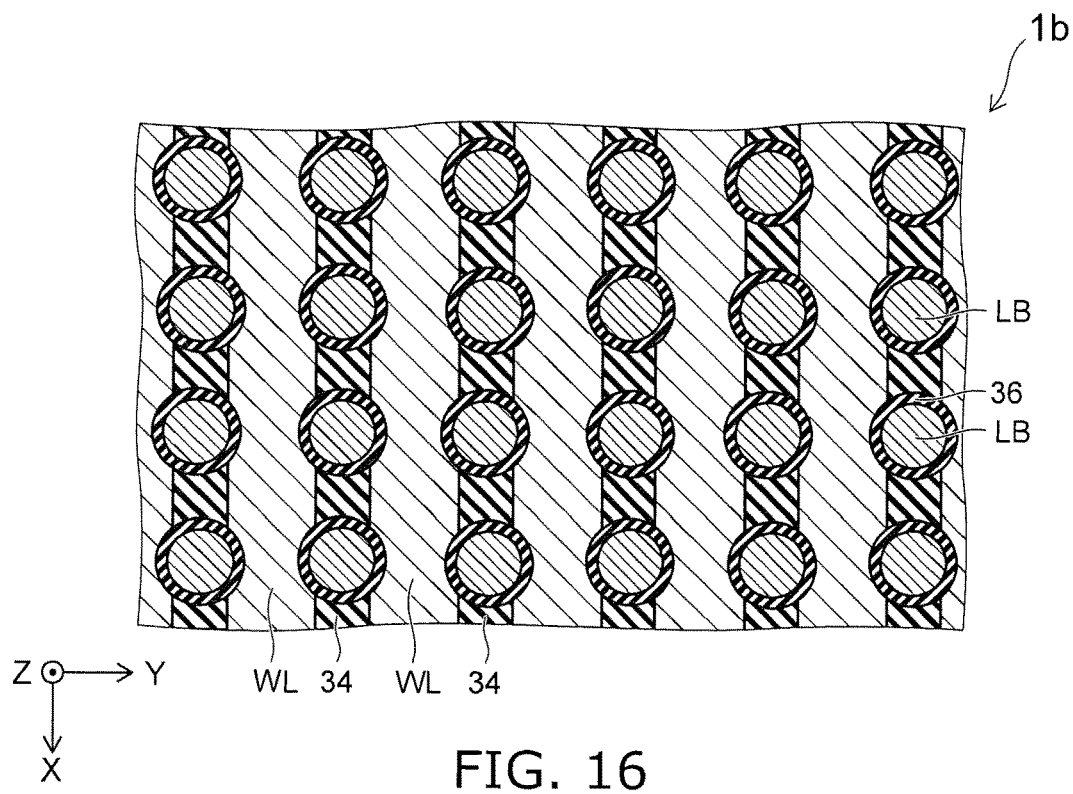
FIG. 16 is a sectional view showing a memory device according to a second variation of the first embodiment.

FIG. 16 is a plan view showing a memory device according to this variation.

As shown in FIG. 16, in the memory device 1b according to this variation, as viewed in the Z-direction, silicon members 21 (see FIG. 3) and local bit lines LB are arranged in a matrix along the X-direction and the Y-direction.

The configuration, operation, manufacturing method, and effect of this variation other than the foregoing are similar to those of the above first embodiment.

(Third Variation of the First Embodiment)

Next, a third variation of the first embodiment is described.

Figure 17:
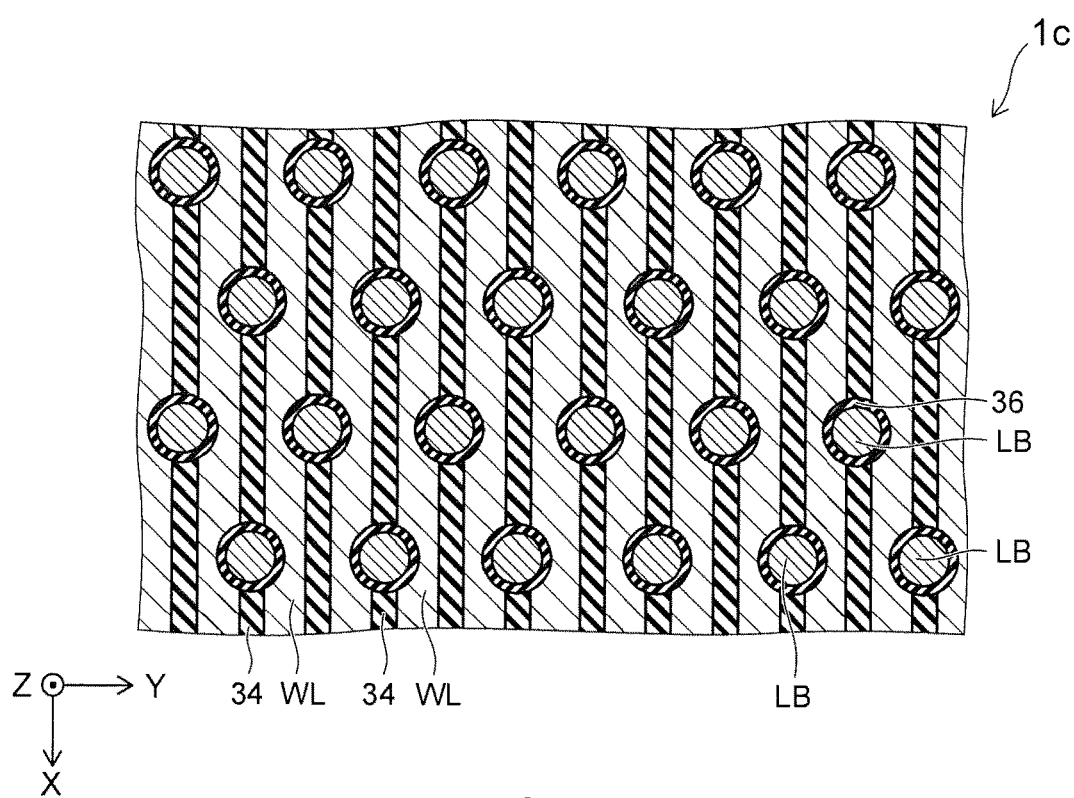
FIG. 17 is a sectional view showing a memory device according to a third variation of the first embodiment.

FIG. 17 is a plan view showing a memory device according to this variation.

As shown in FIG. 17, in the memory device 1c according to this variation, the insulating members 34 and the word lines WL have a narrower width and a shorter arrangement pitch in the Y-direction than those of the memory device 1 (see FIG. 1) according to the first embodiment. As viewed in the Z-direction, the silicon members 21 (see FIG. 3) and the local bit lines LB are arranged in a staggered arrangement different from that of the first embodiment. In the memory device 1c, a generally regular triangle is formed by linking the centers of three local bit lines LB adjacent to one another.

The configuration, operation, manufacturing method, and effect of this variation other than the foregoing are similar to those of the above first embodiment.

(Fourth Variation of the First Embodiment)

Next, a fourth variation of the first embodiment is described.

Figure 18:
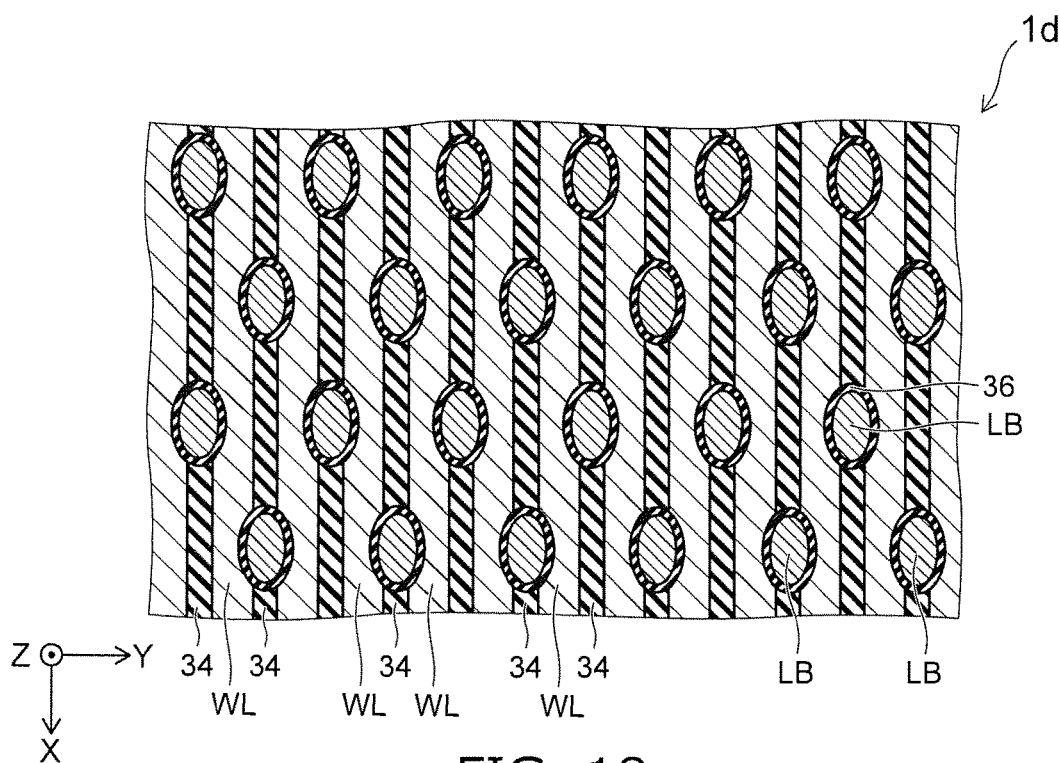
FIG. 18 is a sectional view showing a memory device according to a fourth variation of the first embodiment.

FIG. 18 is a plan view showing a memory device according to this variation.

As shown in FIG. 18, the memory device 1d according to this variation is different from the memory device 1c (see FIG. 17) according to the above third variation in that the Y-direction length of the local bit line LB is shorter than the X-direction length. As viewed in the Z-direction, the local bit line LB is shaped like e.g. an ellipse or an oval. This can suppress more effectively the interference between the local bit lines LB adjacent in the Y-direction even if the arrangement pitch of the word lines WL is made shorter.

The configuration, operation, manufacturing method, and effect of this variation other than the foregoing are similar to those of the above third variation.

(Fifth Variation of the First Embodiment)

Next, a fifth variation of the first embodiment is described.

Figure 19:
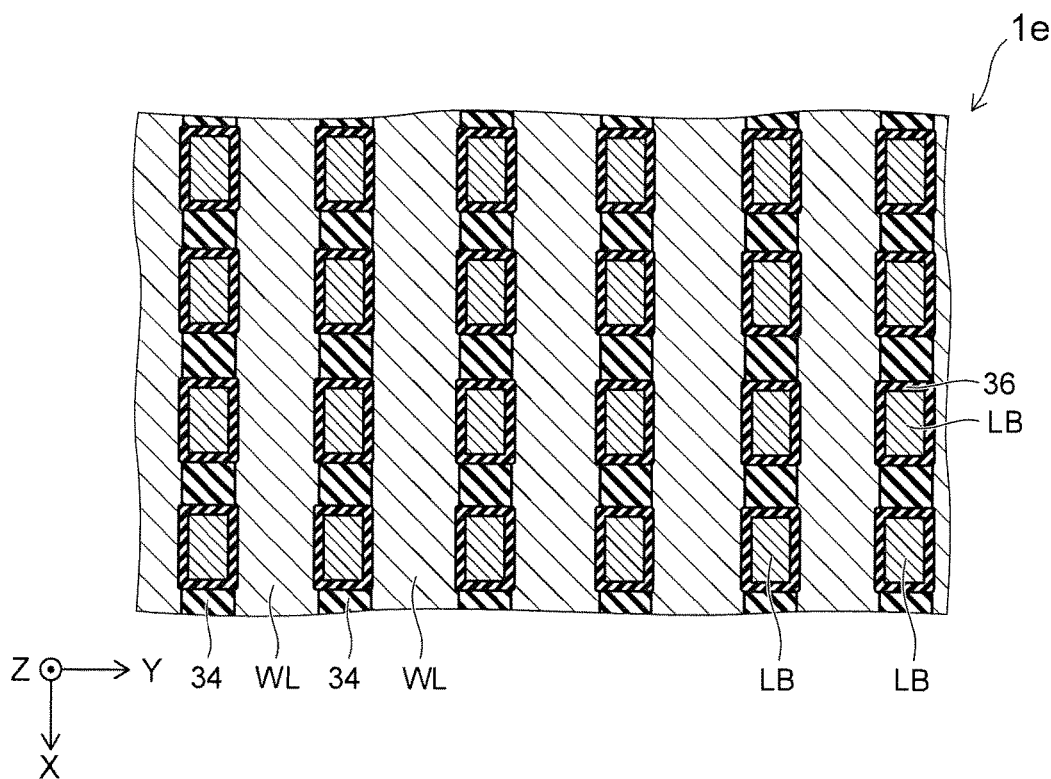
FIG. 19 is a sectional view showing a memory device according to a fifth variation of the first embodiment.

FIG. 19 is a plan view showing a memory device according to this variation.

As shown in FIG. 19, the memory device 1e according to this variation is different from the memory device 1b (see FIG. 16) according to the above second variation in that the local bit line LB is shaped like a quadrangular prism. The Y-direction length of the local bit line LB is generally equal to the Y-direction length of the insulating member 34.

Next, a method for manufacturing the memory device according to this variation is described.

Figure 20:
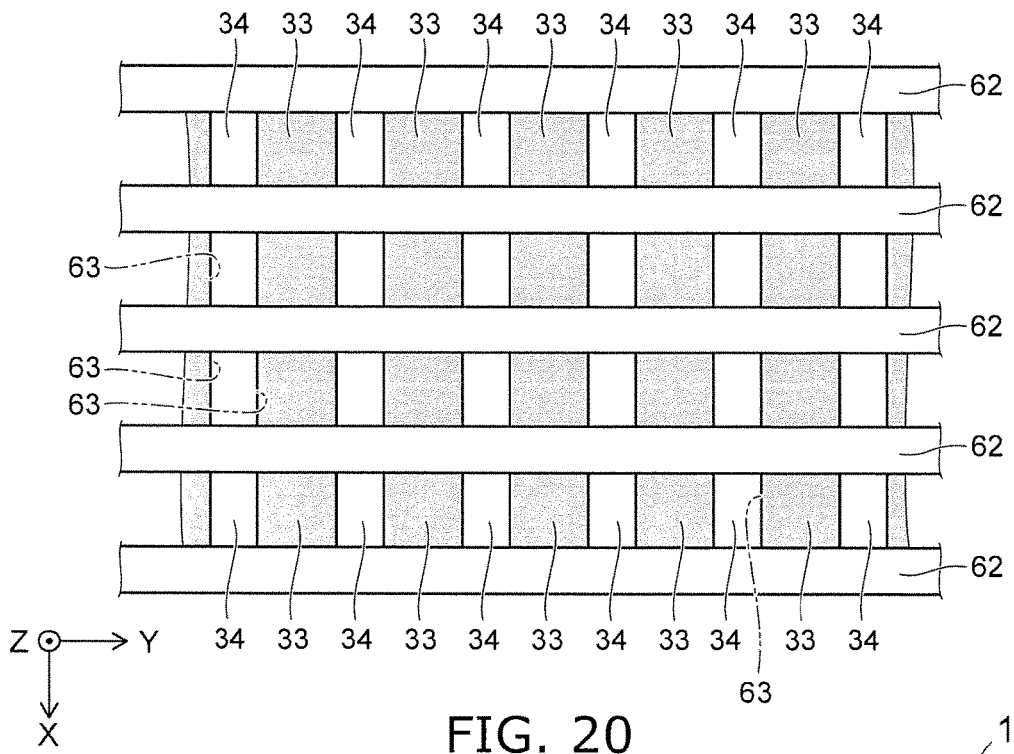
FIG. 20 is a plan view showing a method for manufacturing the memory device according to the fifth variation of the first embodiment.

FIG. 20 is a plan view showing a method for manufacturing the memory device according to this variation.

First, the steps shown in FIGS. 5A to 7B are performed. At this time, the insulating member 34 is formed from an insulating material different from that of the interconnect-to-interconnect insulating film 33 and the silicon nitride film 51, such as impurity-containing silicon oxide.

Next, as shown in FIG. 20, a resist pattern 62 extending in the X-direction is formed on the stacked body 30. The uppermost interconnect-to-interconnect insulating film 33 of the stacked body 30 and the resist pattern 62 are used as a mask to perform anisotropic etching such as the RIE method. This anisotropic etching is performed under the condition such that the etching rate of the insulating member 34 is higher than the etching rate of the interconnect-to-interconnect insulating film 33. Thus, the portion of the insulating member 34 not covered with the resist pattern 62 is removed. Accordingly, a hole 63 shaped like a quadrangular prism is formed.

Subsequently, the steps shown in FIGS. 9A to 14B are performed. Thus, the memory device according to this variation is manufactured.

This variation can suppress more effectively the interference between the local bit lines LB adjacent in the Y-direction even if the arrangement pitch of the word lines WL is made shorter. The holes 63 can be formed in a self-aligned manner. Thus, the hole 63 has high shape accuracy, and can be formed easily.

The configuration, operation, manufacturing method, and effect of this variation other than the foregoing are similar to those of the above second variation.

(Sixth Variation of the First Embodiment)

Next, a sixth variation of the first embodiment is described.

Figure 21:
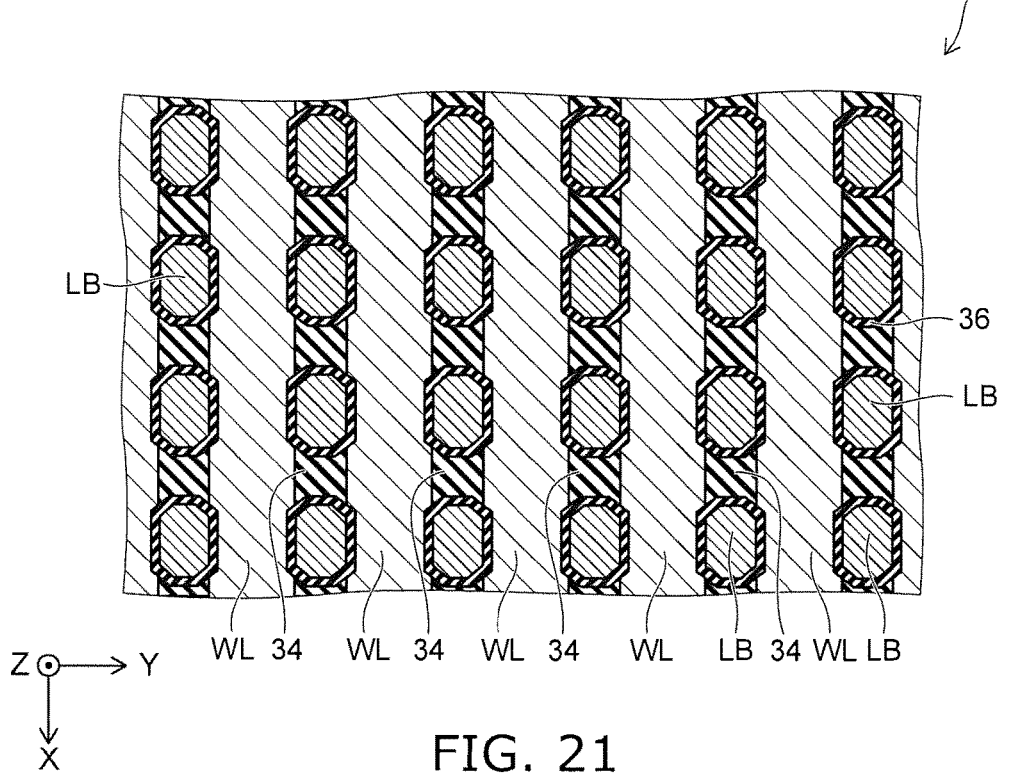
FIG. 21 is a sectional view showing a memory device according to a sixth variation of the first embodiment.

FIG. 21 is a plan view showing a memory device according to this variation.

As shown in FIG. 21, the memory device 1f according to this variation is different from the memory device 1e (see FIG. 19) according to the above fifth variation in that as viewed in the Z-direction, the surface of the local bit line LB facing the X-direction is curved convexly. The memory device 1f can be realized by using an etching condition different from that of the fifth variation.

The configuration, operation, manufacturing method, and effect of this variation other than the foregoing are similar to those of the above fifth variation.

(Seventh Variation of the First Embodiment)

Next, a seventh variation of the first embodiment is described.

Figure 22:
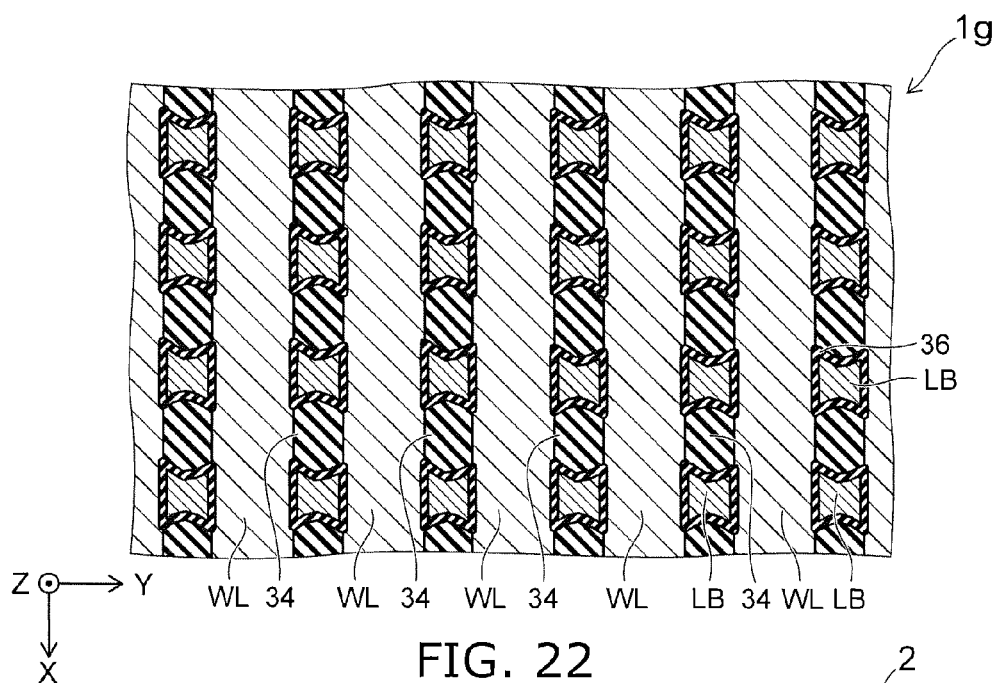
FIG. 22 is a sectional view showing a memory device according to a seventh variation of the first embodiment.

FIG. 22 is a plan view showing a memory device according to this variation.

As shown in FIG. 22, the memory device 1g according to this variation is different from the memory device 1e (see FIG. 19) according to the above fifth variation in that as viewed in the Z-direction, the surface of the local bit line LB facing the X-direction is curved concavely. The memory device 1g can be realized by using an etching condition different from that of the fifth variation.

The configuration, operation, manufacturing method, and effect of this variation other than the foregoing are similar to those of the above fifth variation.

(Second Embodiment)

Next, a second embodiment is described.

Figure 23:
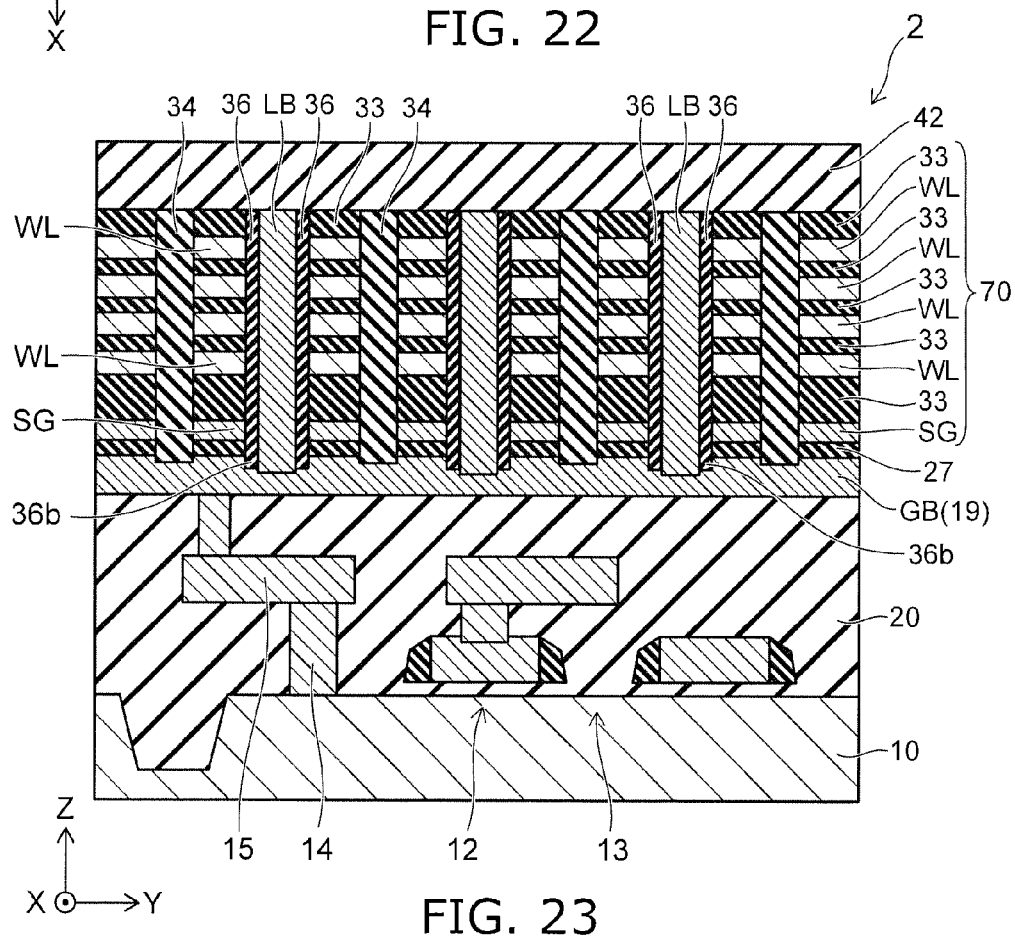
FIG. 23 is a sectional view showing a memory device according to a second embodiment.

FIG. 23 is a sectional view showing a memory device according to the embodiment.

FIG. 23 shows a cross section corresponding to FIG. 3 of the above first embodiment.

As shown in FIG. 23, in the memory device 2 according to the embodiment, the silicon member 21 (see FIG. 3) is not provided. The local bit line LB is formed from a semiconductor material such as polysilicon. The lower part of the local bit line LB functions as the silicon member 21. The gate insulating film 22 (see FIG. 3) is not provided. The lower part of the resistance change film 36 functions as the gate insulating film 22. Furthermore, as viewed in the Z-direction, the shape of the select gate line SG is the same as the shape of the word line WL. The material of the select gate line SG is the same as the material of the word line WL, such as titanium nitride (TiN). Thus, a thin film transistor (TFT) is formed from the lower part of the local bit line LB, the lower part of the resistance change film 36, and the select gate line SG. The lower end 36a of the resistance change film 36 is placed in the global bit line GB.

Next, a method for manufacturing the memory device according to the embodiment is described.

The following description is focused on a method for forming the portion of the stacked body except the end portion.

FIGS. 24A to 32B show a method for manufacturing the memory device according to the embodiment.

Figure 24A:
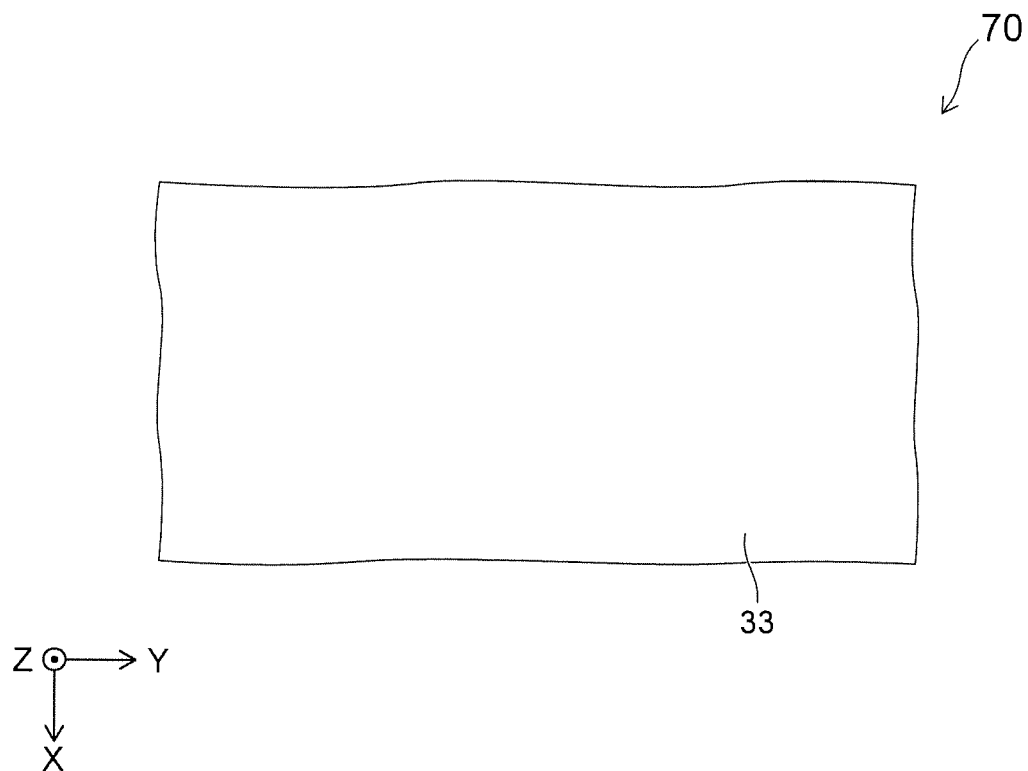
FIGS. 24A to 32B show a method for manufacturing the memory device according to the second embodiment.
Figure 24B:
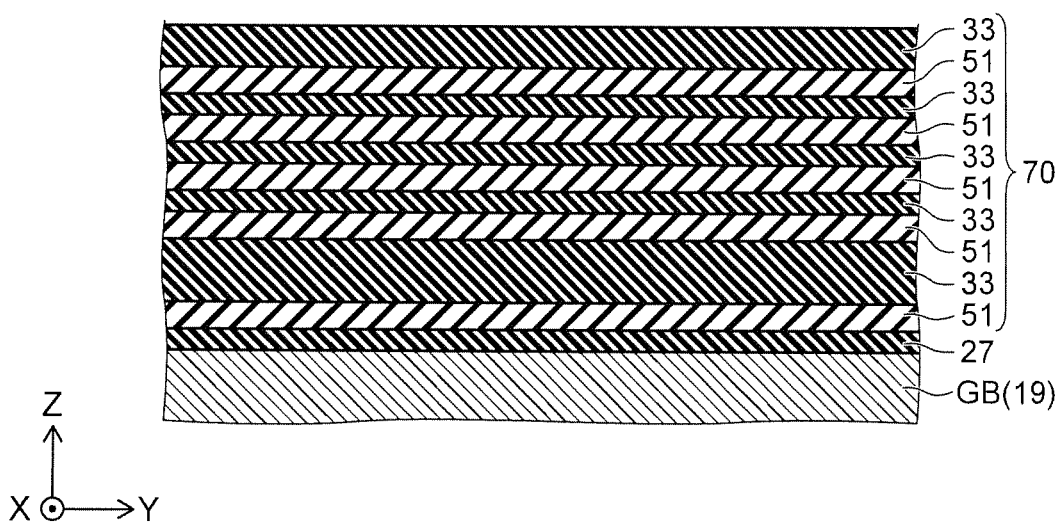

FIG. 24A is a plan view, and FIG. 24B is a sectional view thereof. This also applies similarly to FIGS. 25A to 32B.

First, as shown in FIG. 23, an interlayer insulating film 20 is formed on a silicon substrate 10. A circuit 12 is formed in an upper portion of the silicon substrate 10 and in the interlayer insulating film 20. Next, a plurality of global bit lines GB extending in the Y-direction are formed to form an interconnect layer 19.

Next, as shown in FIGS. 24A and 24B, silicon oxide is deposited to form a barrier film 27 on the interconnect layer 19. Next, silicon nitride films 51 made of silicon nitride (SiN) and interconnect-to-interconnect insulating films 33 made of silicon oxide (SiO) are alternately stacked to form a stacked body 70. At this time, the thickness of the lowermost interconnect-to-interconnect insulating film 33, i.e., the interconnect-to-interconnect insulating film 33 placed between the lowermost silicon nitride film 51 and the second lowest silicon nitride film 51, and the uppermost interconnect-to-interconnect insulating film 33 is made thicker than that of the other interconnect-to-interconnect insulating films 33.

Next, as in the above first embodiment, an end portion of the stacked body 70 in the X-direction is processed into a staircase shape to form a terrace T for each silicon nitride film 51. Next, an interlayer insulating film 40 (see FIG. 2) is formed around the stacked body 70.

Figure 25A:
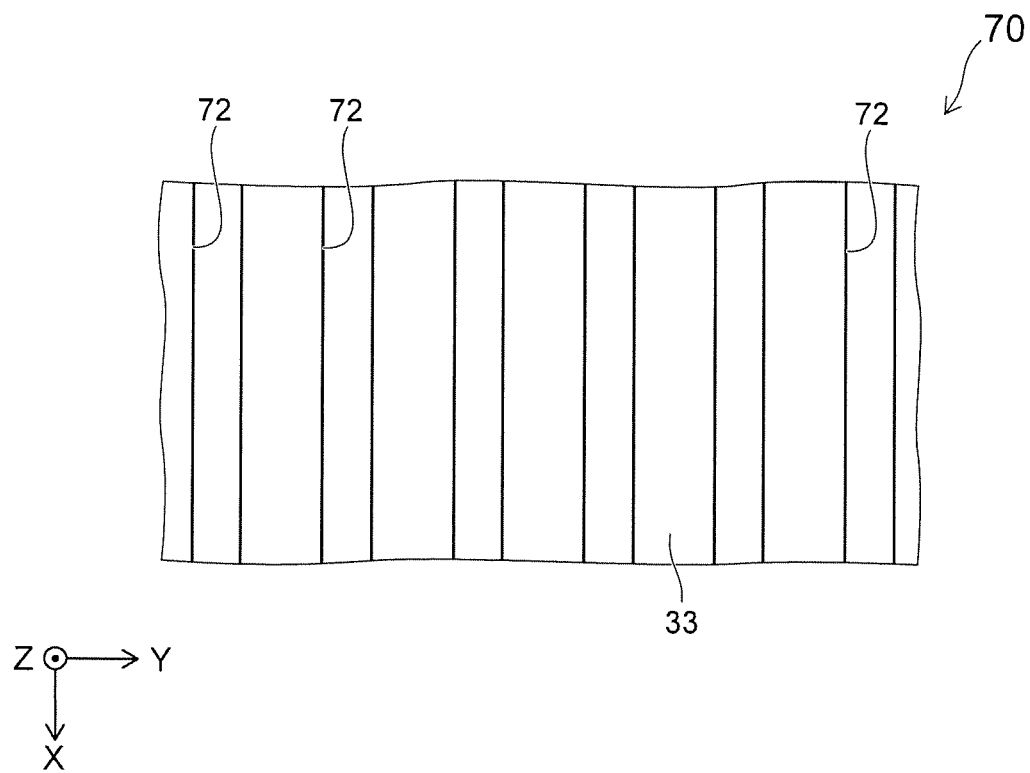
Figure 25B:
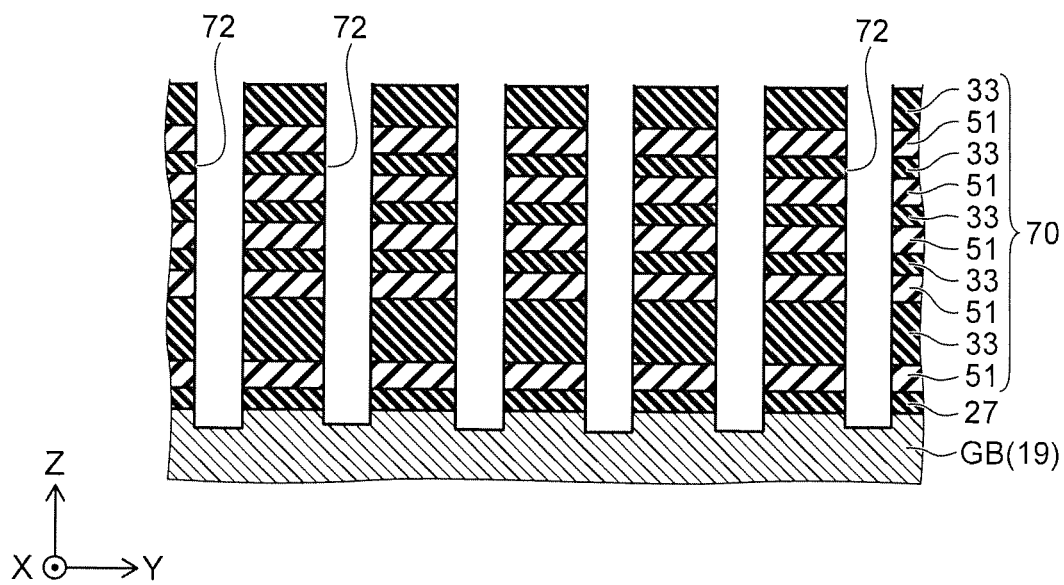

Next, as shown in FIGS. 25A and 25B, anisotropic etching such as the RIE method is performed. Thus, a plurality of trenches 72 extending in the X-direction are formed in the stacked body 70. The trench 72 penetrates through the stacked body 70 and the barrier film 27. The lower end of the trench 72 enters the upper part of the interconnect layer 19. However, the trench 72 does not penetrate through the interconnect layer 19.

Figure 26A:
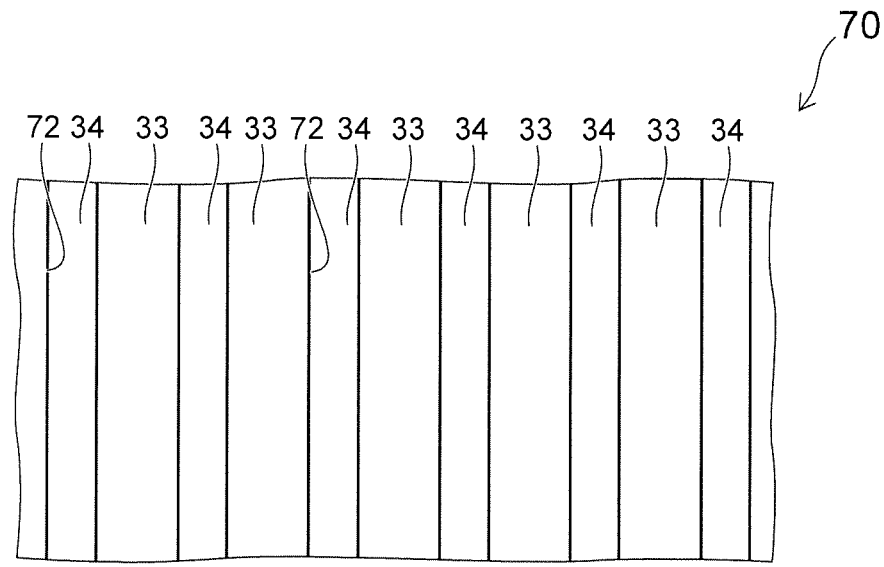
Figure 26B:
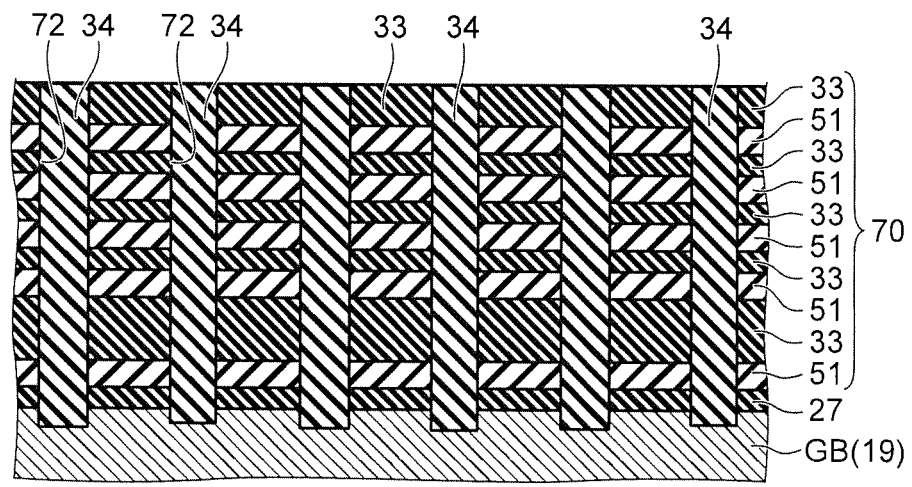

Next, as shown in FIGS. 26A and 26B, silicon oxide is deposited, and planarization processing such as CMP is performed. Thus, an insulating member 34 is buried in the trench 72.

Figure 27A:
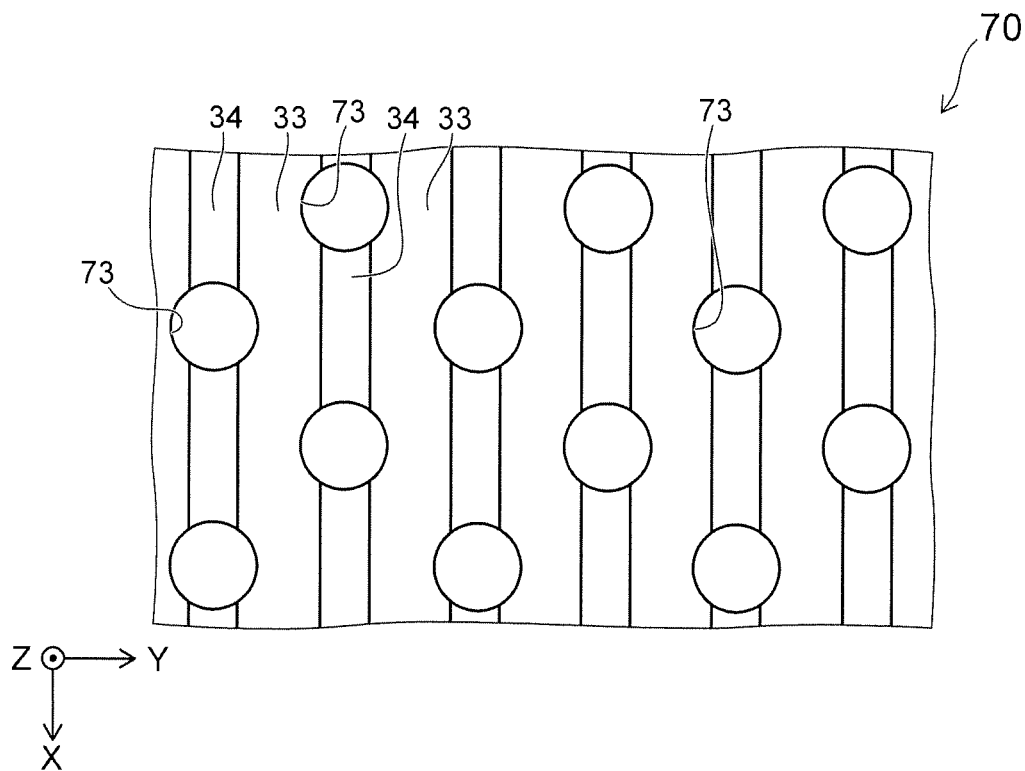
Figure 27B:
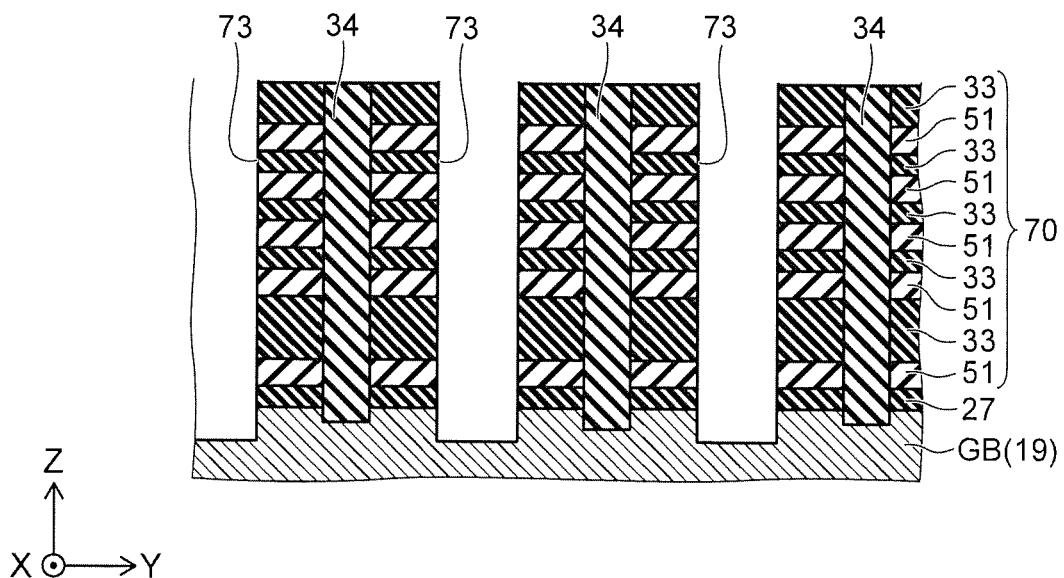

Next, as shown in FIGS. 27A and 27B, the global bit line GB is used as an etching stopper to perform anisotropic etching such as the RIE method. Thus, a plurality of holes 73 are formed in part of the directly overlying region of the global bit line GB in the stacked body 70. The hole 73 penetrates through the stacked body 70 and the barrier film 27 to the global bit line GB, but do not penetrate through the global bit line GB. The silicon nitride film 51 and the interconnect-to-interconnect insulating film 33 are exposed at the inner surface of the hole 73. As viewed in the Z-direction, the holes 73 are arranged in e.g. a staggered arrangement. Like the holes 54 (see FIG. 1) of the above first embodiment, holes are formed also in the end portion of the stacked body 70 and utilized in the subsequent steps. However, the description of these holes is omitted in the embodiment.

Figure 28A:
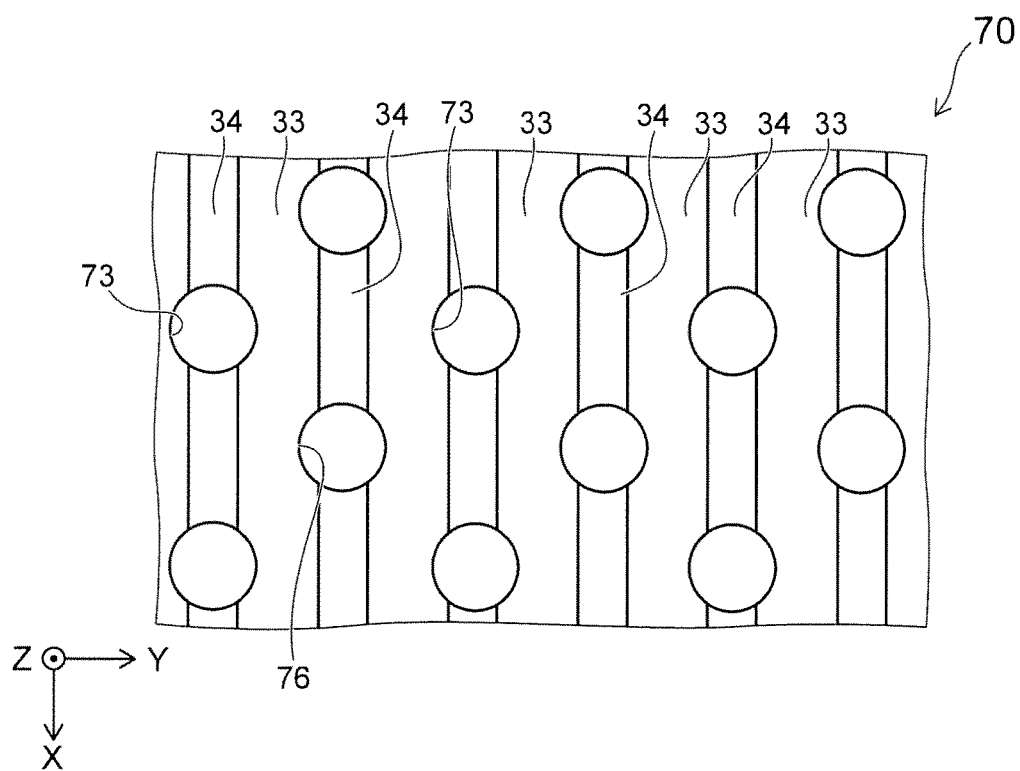
Figure 28B:
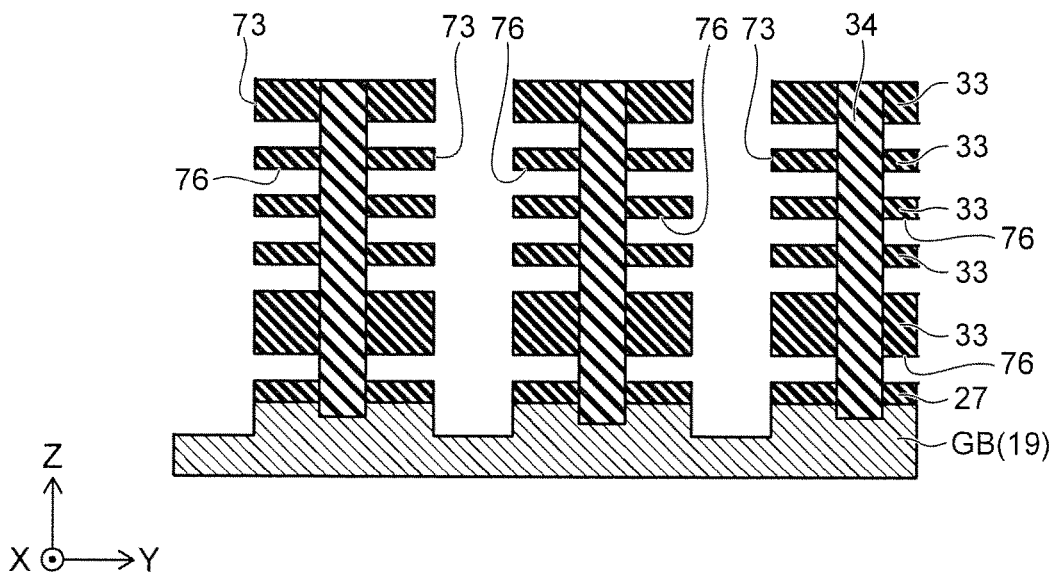

Next, as shown in FIGS. 28A and 28B, isotropic etching such as wet etching is performed through the hole 73. Thus, part of the silicon nitride film 51 (see FIG. 27B) is removed, and a space 76 is formed. At this time, as in the above first embodiment, the silicon nitride film 51 is removed with the hole 73 at the center. Thus, part of the inner surface of the space 76 is shaped like a circular arc about the hole 73 placed at the outermost periphery. However, the silicon nitride film 51 may be completely removed.

Figure 29A:
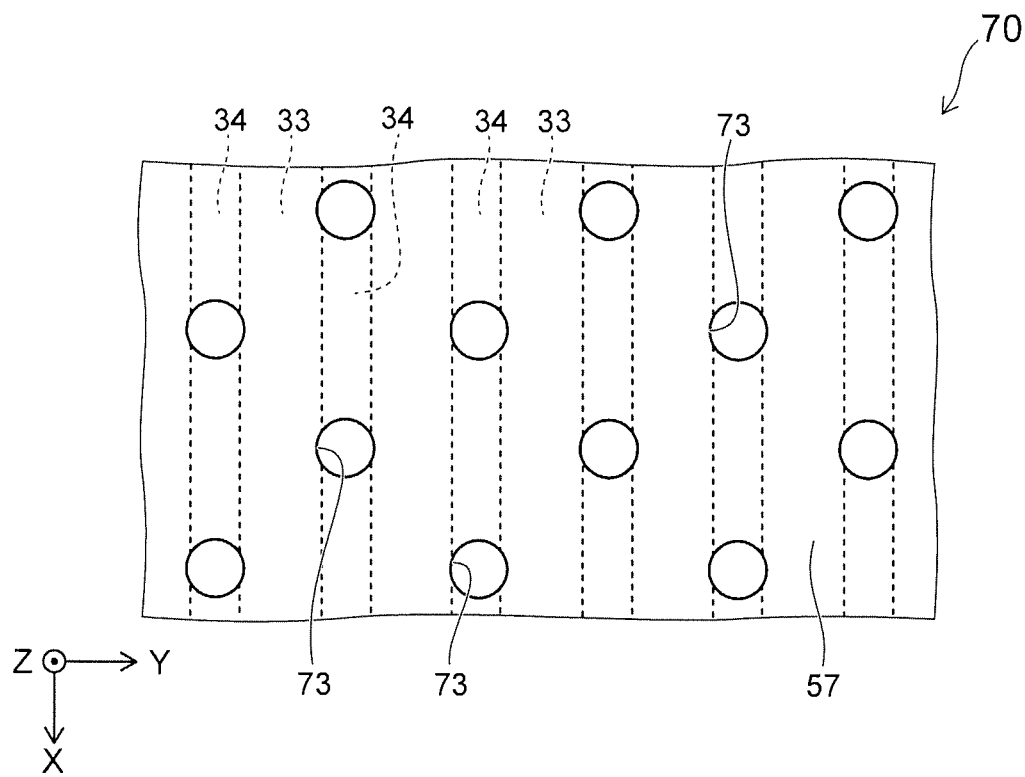
Figure 29B:
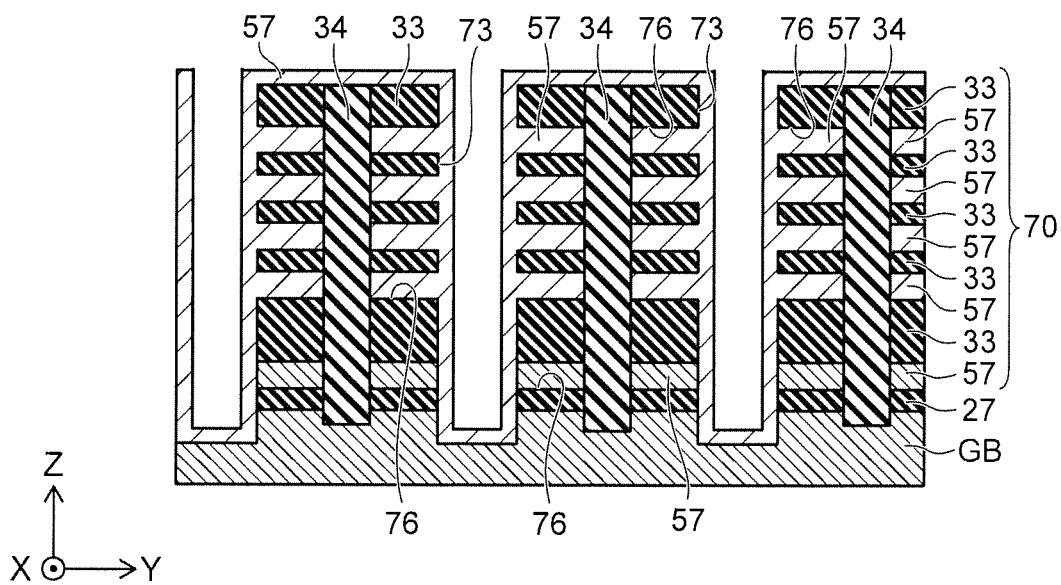

Next, as shown in FIGS. 29A and 29B, a conductive material such as titanium nitride (TiN) is deposited on the entire surface to form a conductive layer 57. The conductive layer 57 enters also the space 76 through the hole 73. At this time, a seam depressed toward the back of the space 76 is formed near the boundary between the space 76 and the hole 73. The seam is not depicted in FIGS. 29A and 29B.

Figure 30A:
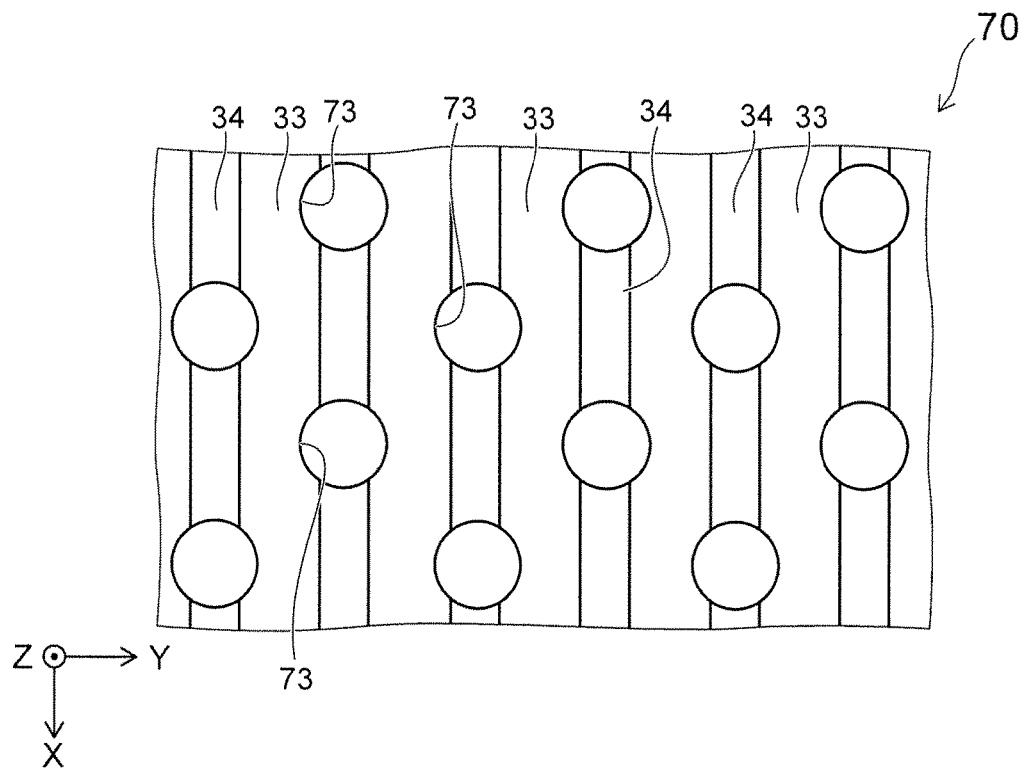
Figure 30B:
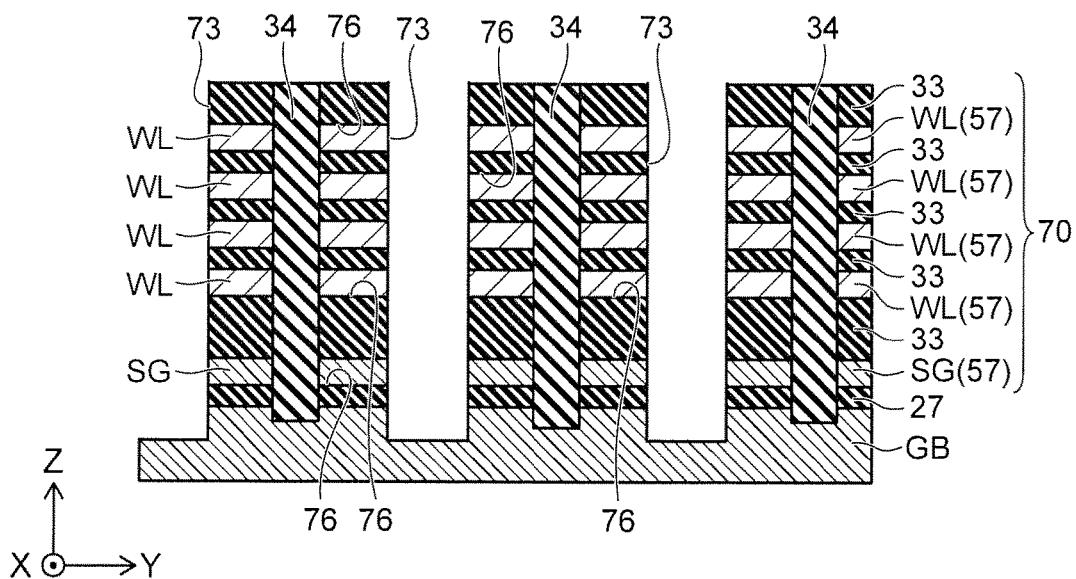

Next, as shown in FIGS. 30A and 30B, the conductive layer 57 is recessed to remove the portion of the conductive layer 57 formed in the hole 73. As a result, the conductive layer 57 remains in the space 76. Thus, the conductive layer 57 remaining in the lowermost space 76 constitutes a select gate line SG, and the conductive layer 57 remaining in the other space 76 constitutes a word line WL. At this time, the seam formed in the conductive layer 57 remains as a seam of the select gate line SG and a seam of the word line WL. The arc-shaped inner surface of the space 76 constitutes an interface between the silicon nitride film 51 and the select gate line SG and an interface 39 (see FIG. 1) between the silicon nitride film 51 and the word line WL.

Figure 31A:
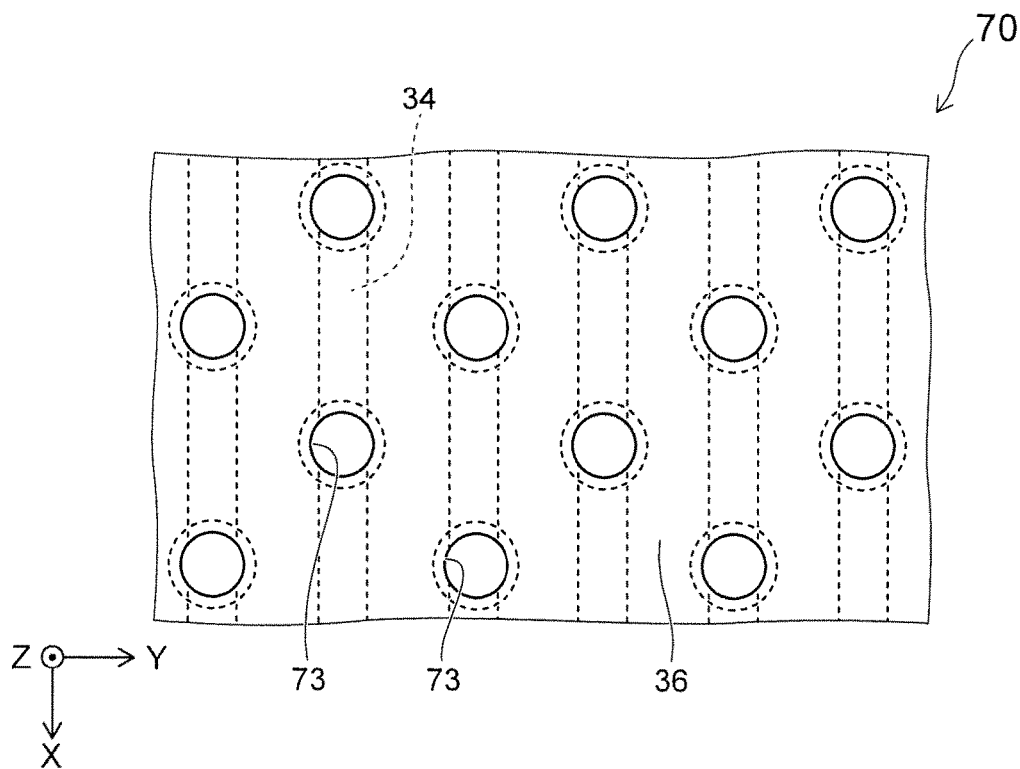
Figure 31B:
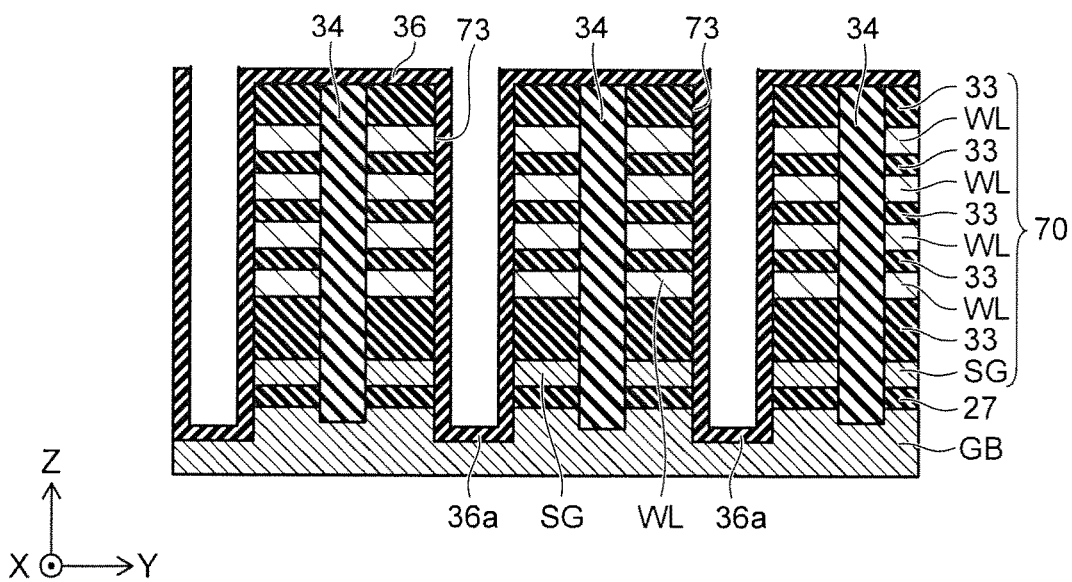

Next, as shown in FIGS. 31A and 31B, metal oxide such as hafnium oxide is deposited on the entire surface to form a resistance change film 36. The resistance change film 36 is formed also on the inner surface of the hole 73. At this time, a seam 36b (see FIG. 4) is formed in the portion of the resistance change film 36 covering the seam of the select gate line SG and the seam of the word line WL. The lower end 36a of the resistance change film 36 is placed in the global bit line GB.

Figure 32A:
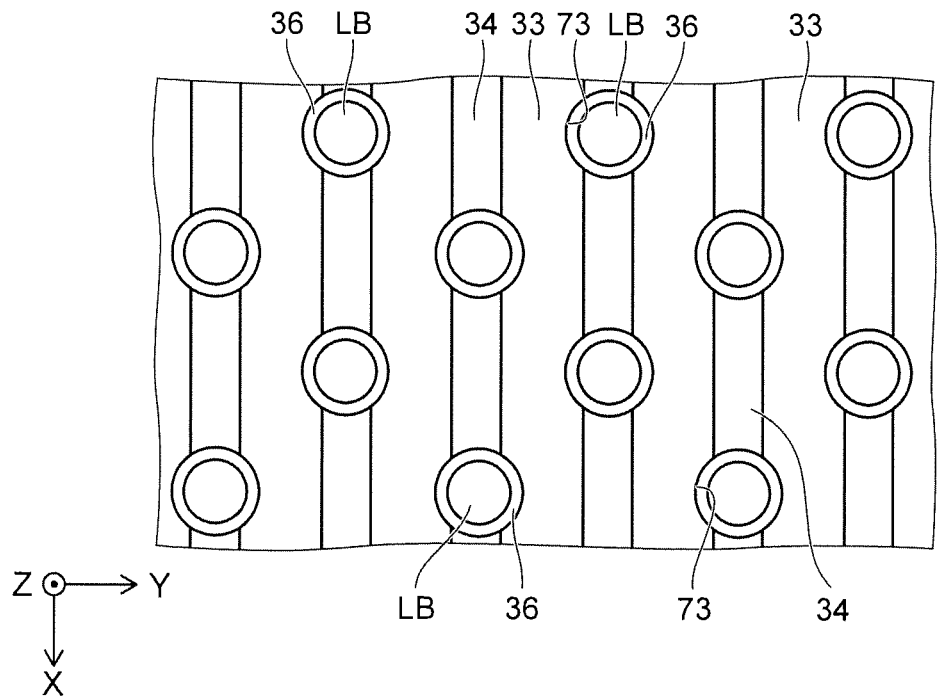
Figure 32B:
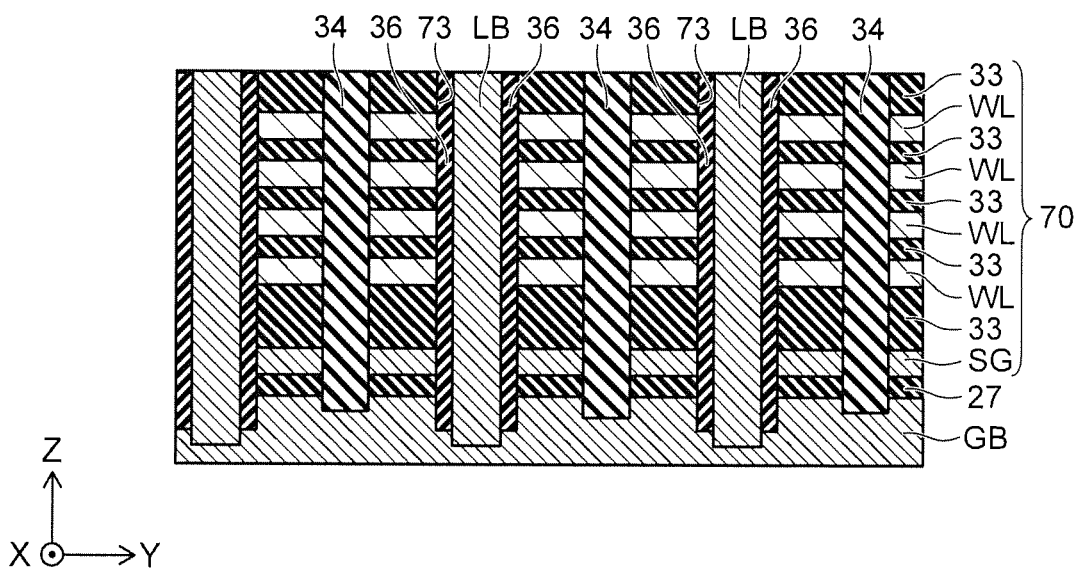

Next, as shown in FIGS. 32A and 32B, anisotropic etching such as the RIE method is performed to remove the resistance change film 36 from the bottom surface of the hole 73. Accordingly, the global bit line GB is exposed at the bottom surface of the hole 73. At this time, the resistance change film 36 is removed also from the upper surface of the stacked body 70. As a result, the resistance change film 36 remains like a tube on the inner side surface of the hole 73.

Next, silicon as a semiconductor material is deposited, and planarization processing such as CMP is performed. Thus, a local bit line LB made of polysilicon is formed in the hole 73. The lower end of the local bit line LB is brought into contact and connected with the global bit line GB.

The subsequent steps are similar to those of the above first embodiment. Thus, the memory device 2 according to the embodiment is manufactured.

Next, the effect of the embodiment is described.

According to the embodiment, the lower part of the local bit line LB is caused to function as a silicon member 21 (see FIG. 3). The lower part of the resistance change film 36 is caused to function as a gate insulating film 22 (see FIG. 3). The select gate line SG is formed in the same step as the word line WL. Thus, the transistor for selecting the local bit line LB can be formed in the same step as the memory cell MC (see FIG. 4). Accordingly, the embodiment requires a smaller number of steps in manufacturing the memory device than the above first embodiment. Thus, the memory device 2 requires low manufacturing cost and is easily manufactured.

The configuration, operation, manufacturing method, and effect of the embodiment other than the foregoing are similar to those of the above first embodiment.

(Third Embodiment)

Next, a third embodiment is described.

Figure 33:
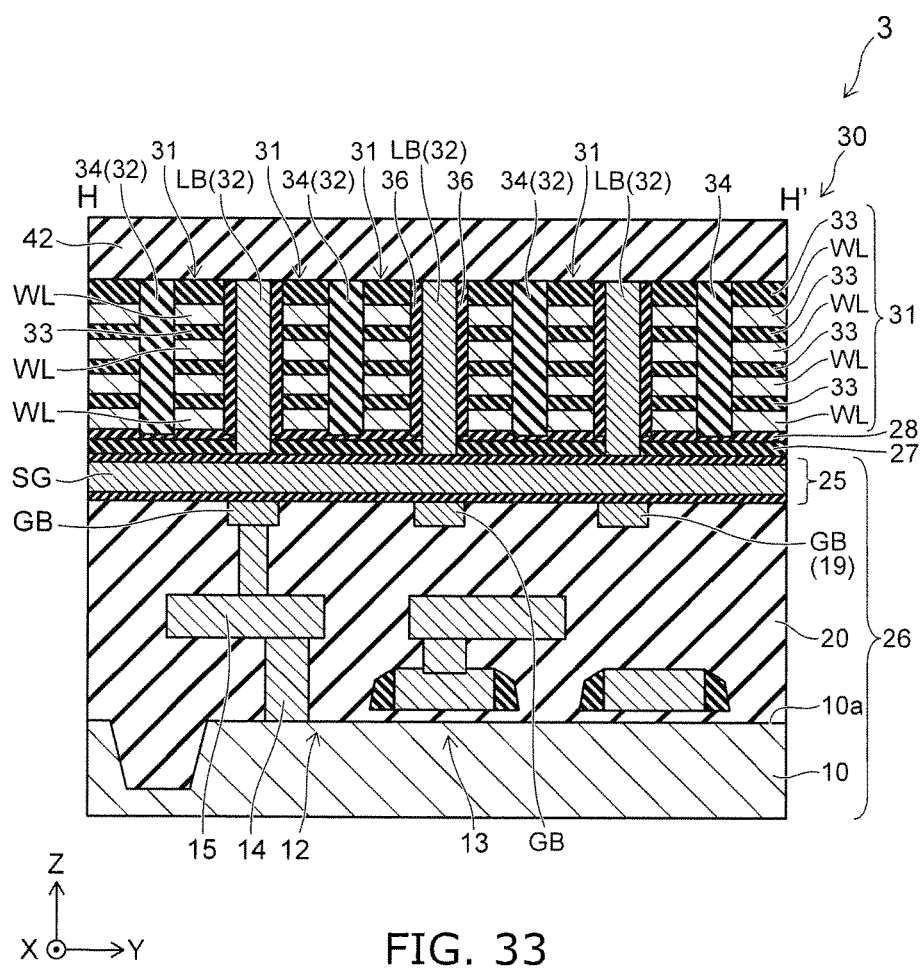
FIG. 33 is a sectional view showing a memory device according to a third embodiment.

FIG. 33 is a sectional view showing a memory device according to the embodiment.

FIG. 33 shows a cross section corresponding to FIG. 3 of the above first embodiment.

As shown in FIG. 33, in the memory device 3 according to the embodiment, the global bit line GB extends in the X-direction. That is, the extending direction of the global bit line GB is the same as the extending direction of the word line WL. The select gate line SG extends in the Y-direction. That is, the extending direction of the select gate line SG is orthogonal to the extending direction of the global bit line GB and the word line WL.

The configuration, operation, manufacturing method, and effect of the embodiment other than the foregoing are similar to those of the above first embodiment.

The embodiments described above can realize an easy-to-manufacture memory device and a manufacturing method thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A memory device comprising:
   a first interconnect extending in a first direction;
   a plurality of semiconductor members extending in a second direction crossing the first direction, a first end of one of the semiconductor members being connected to the first interconnect;
   a second interconnect provided between the plurality of semiconductor members and extending in a third direction crossing the first direction and the second direction;
   a first insulating film provided between one of the plurality of semiconductor members and the second interconnect;
   a plurality of third interconnects extending in the second direction, one of the plurality of third interconnects being connected to a second end of one of the plurality of semiconductor members;
   a plurality of fourth interconnects provided between the plurality of third interconnects and arranged along the second direction;
   a resistance change film provided between one of the plurality of third interconnects and the plurality of fourth interconnects; and
   a first film provided between the second interconnect and one of the fourth interconnects, interposing between one of the semiconductor members and the resistance change film, and not interposing between one of the semiconductor members and one of the third interconnects connected to each other.

2. The device according to claim 1, wherein an end portion of the resistance change film on a semiconductor member side is placed in the first film.

3. The device according to claim 1, wherein one of the semiconductor members includes a conductive layer provided at the second end and containing a metal.

4. The device according to claim 1, further comprising:
   a plurality of second films provided on an opposite side of the plurality of third interconnects as viewed from the plurality of fourth interconnects; and
   a second insulating film provided between the plurality of fourth interconnects and between the plurality of second films and being different in composition from the second film,
   wherein part of an interface between the fourth interconnect and the second film is shaped like a circular arc about the third interconnect.

5. The device according to claim 1, further comprising:
   a plurality of second films provided on an opposite side of the plurality of third interconnects as viewed from the plurality of fourth interconnects; and
   a second insulating film provided between the plurality of fourth interconnects and between the plurality of second films and being different in composition from the second film,
   wherein the fourth interconnects extend in the third direction,
   the plurality of third interconnects are arranged also in the third direction, and
   a position in the first direction of an interface between the fourth interconnect and the second film varies along the third direction with a same pitch as an arrangement pitch of the plurality of third interconnects in the third direction.

6. The device according to claim 1, wherein a seam depressed away from the third interconnect is formed on a surface of the resistance change film on the third interconnect side.

7. The device according to claim 1, wherein a seam depressed away from the third interconnect is formed on a surface of the fourth interconnect on the third interconnect side.

8. The device according to claim 1, further comprising:
a semiconductor substrate; and
a second insulating film provided between the semiconductor substrate and the first interconnect,
wherein a circuit is formed in a portion of the semiconductor substrate on the second insulating film side and the second insulating film.

9. A memory device comprising:
a first interconnect extending in a first direction;
a plurality of second interconnects connected to the first interconnect, extending in a second direction crossing the first direction, and made of a semiconductor material;
a plurality of third interconnects provided between the plurality of second interconnects, extending in a third direction crossing the first direction and the second direction, and arranged along the second direction; and
a resistance change film provided between one of the plurality of second interconnects and the plurality of third interconnects and having a first end placed in the first interconnect.

10. The device according to claim 9, wherein a transistor is formed from the one of the second interconnects, the resistance change film, and a lowermost one of the third interconnects.

11. The device according to claim 9, further comprising:
a plurality of first films provided on opposite side of the plurality of second interconnects as viewed from the plurality of third interconnects; and
a first insulating film provided between the plurality of third interconnects and between the plurality of first films and being different in composition from the first film,
wherein part of an interface between the third interconnect and the first film is shaped like a circular arc about the second interconnect.

12. The device according to claim 9, further comprising:
a plurality of first films, one of the plurality of third interconnects being disposed between one of the plurality of second interconnects and one of the plurality of first films; and
a first insulating film provided between the plurality of third interconnects and between the plurality of first films and being different in composition from the first film,
wherein the plurality of second interconnects are arranged also in the third direction, and
a position in the first direction of an interface between the third interconnect and the first film varies along the third direction with a same pitch as an arrangement pitch of the plurality of second interconnects in the third direction.

13. The device according to claim 9, wherein a seam depressed away from the second interconnect is formed on a surface of the resistance change film on the second interconnect side.

14. The device according to claim 9, wherein a seam depressed away from the second interconnect is formed on a surface of the third interconnect on the second interconnect side.

15. A method for manufacturing a memory device, comprising;
forming a first film on an intermediate structural body, the intermediate structural body including a first interconnect extending in a first direction, a plurality of semiconductor members provided on the first interconnect, extending in a second direction crossing the first direction, and having a first end connected to the first interconnect, a first insulating film provided on a side surface of one of the plurality of semiconductor members, and a second interconnect provided on a side surface of the first insulating film and extending in a third direction crossing the first direction and the second direction;
forming a stacked body by alternately stacking a plurality of second insulating films and a plurality of second films on the first film, the second film being different in composition from the second insulating film;
forming a plurality of trenches in a portion including a directly overlying region of the semiconductor member in the stacked body;
burying an insulating member in one of the trenches;
forming a hole in the directly overlying region of the semiconductor member in the stacked body, the hole dividing the insulating member and reaching the first film;
removing at least part of the second film through the hole;
burying a third interconnect through the hole in a space formed by removing the second film;
forming a resistance change film on an inner surface of the hole;
removing a portion of the resistance change film placed on a bottom surface of the hole and a portion of the first film in a directly overlying region of the hole; and
forming a fourth interconnect in the hole and connecting the fourth interconnect to a second end of the semiconductor member.

16. The method according to claim 15, wherein the burying a third interconnect includes:
depositing a conductive layer; and
removing the conductive layer from inside the hole and leaving the conductive layer in the space.

17. The method according to claim 15, wherein the removing at least part of the second film includes performing wet etching on the second film.

18. The method according to claim 15, wherein in the forming a hole, the bottom surface of the hole is placed in the first film.

19. A method for manufacturing a memory device, comprising:
forming a stacked body by alternately stacking a plurality of first insulating films and a plurality of first films on a first interconnect layer including a first interconnect extending in a first direction, the first film being different in composition from the first insulating film;
forming a plurality of trenches in the stacked body, the trenches extending in a second direction crossing the first direction;
burying an insulating member in one of the trenches;
forming a hole in part of a directly overlying region of the first interconnect in the stacked body, the hole dividing the insulating member and reaching the first interconnect layer;

removing at least part of the first film through the hole;
burying a second interconnect through the hole in a space formed by removing the first film;
forming a resistance change film on an inner surface of the hole;
removing a portion of the resistance change film placed on a bottom surface of the hole; and
forming a third interconnect by burying a semiconductor material in the hole and connecting the third interconnect to the first interconnect.

20. The method according to claim 19, wherein in the forming a stacked body, the first insulating film placed between a lowermost one of the first films and a second lowest one of the first films is made thicker than the other first insulating films.

* * * * *